United States Patent
Zhu

(10) Patent No.: US 7,339,230 B2
(45) Date of Patent: Mar. 4, 2008

(54) STRUCTURE AND METHOD FOR MAKING HIGH DENSITY MOSFET CIRCUITS WITH DIFFERENT HEIGHT CONTACT LINES

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/306,707

(22) Filed: Jan. 9, 2006

(65) Prior Publication Data

US 2007/0170472 A1 Jul. 26, 2007

(51) Int. Cl.
- H01L 29/76 (2006.01)
- H01L 29/788 (2006.01)
- H01L 29/94 (2006.01)
- H01L 31/062 (2006.01)
- H01L 31/113 (2006.01)

(52) U.S. Cl. .................. 257/316; 257/288; 257/314; 257/315; 257/317; 257/318; 257/319; 257/320; 257/321; 257/322; 257/327; 257/336; 257/344; 257/408; 257/900; 257/920

(58) Field of Classification Search ............... 257/288, 257/314–322, 344, 408, 920, 327, 336, 900
See application file for complete search history.

(56) References Cited

U.S. PATENT DOCUMENTS

| | | | |
|---|---|---|---|
| 5,614,747 A * | 3/1997 | Ahn et al. ............ 257/316 |
| 5,726,479 A | 3/1998 | Matsumoto et al. ...... 257/412 |
| 6,127,216 A * | 10/2000 | Yu ..................... 438/238 |
| 6,136,649 A * | 10/2000 | Hui et al. .............. 438/257 |
| 6,271,087 B1 * | 8/2001 | Kinoshita et al. ....... 438/258 |
| 6,281,559 B1 * | 8/2001 | Yu et al. ............... 257/407 |
| 6,420,752 B1 * | 7/2002 | Ngo et al. ............. 257/315 |
| 6,509,253 B1 * | 1/2003 | Yu ..................... 438/585 |
| 6,734,510 B2 * | 5/2004 | Forbes et al. .......... 257/407 |
| 6,822,334 B2 | 11/2004 | Hori et al. ............. 257/775 |
| 6,894,357 B2 * | 5/2005 | Guo .................... 257/410 |
| 6,924,190 B2 * | 8/2005 | Dennison .............. 438/241 |
| 6,943,071 B2 * | 9/2005 | Fazio et al. ........... 438/201 |
| 7,119,395 B2 * | 10/2006 | Gutsche et al. ........ 257/321 |
| 7,129,539 B2 * | 10/2006 | Iwata et al. ........... 257/324 |
| 2004/0026748 A1 | 2/2004 | Goda et al. ........... 257/390 |
| 2004/0264270 A1 | 12/2004 | Iwata et al. ........... 365/200 |
| 2005/0140002 A1 * | 6/2005 | Shin et al. ............ 257/734 |
| 2006/0170047 A1 * | 8/2006 | Ishimaru .............. 257/347 |

* cited by examiner

*Primary Examiner*—Ida M. Soward
(74) *Attorney, Agent, or Firm*—Gibb & Rahman, LLC; Todd M. C. Li, Esq.

(57) ABSTRACT

Embodiments herein present a structure, method, etc. for making high density MOSFET circuits with different height contact lines. The MOSFET circuits include a contact line, a first gate layer situated proximate the contact line, and at least one subsequent gate layer situated over the first gate layer. The contact line includes a height that is less than a combined height of the first gate layer and the subsequent gate layer(s). The MOSFET circuits further include gate spacers situated proximate the gate layers and a single contact line spacer situated proximate the contact line. The gate spacers are taller and thicker than the contact line spacer.

7 Claims, 22 Drawing Sheets

STRUCTURE AND METHOD FOR MAKING HIGH DENSITY MOSFET CIRCUITS WITH DIFFERENT HEIGHT CONTACT LINES

BACKGROUND OF THE INVENTION

1. Field of the Invention

Embodiments herein present a structure, method, etc. for making high density MOSFET circuits with different height contact lines.

2. Description of the Related Art

Metal-oxide semiconductor field-effect transistors (MOSFETs) are a special type of field-effect transistor (FET) that work by electrically varying the voltage in a channel to control charge carriers (electrons or holes) flow along the channel. The charge carriers enter the channel at the source, and exit via the drain. The charge carriers flow in the channel is controlled by the voltage on an electrode, or the gate, which is located physically between the source and the drain and is insulated from the channel by an extremely thin layer of metal oxide.

There are two ways in which a MOSFET can function. The first is known as depletion mode. When there is no voltage on the gate, the channel exhibits its maximum conductance. As the voltage on the gate increases (either positively or negatively, depending on whether the channel is made of P-type or N-type semiconductor material), the channel conductivity decreases. The second way in which a MOSFET can operate is called enhancement mode. When there is no voltage on the gate, there is in effect no conductive channel, and the device does not conduct. A conductive channel is produced by the application of a voltage to the gate. The greater the gate voltage, the better the device conducts.

The MOSFET has certain advantages over the conventional junction FET, or JFET. Because the gate is insulated electrically from the channel, no/small current flows between the gate and the channel, no matter what the gate voltage (as long as it does not become so great that it causes physical breakdown of the metallic oxide layer). Thus, the MOSFET has practically infinite impedance. This makes MOSFET circuits useful for power amplifiers. The devices are also well suited to high-speed switching applications. Some integrated circuits (ICs) contain tiny MOSFET circuits and are used in high performance ICs such as computers or servers.

Despite its advantages, MOSFET circuits are susceptible to source and drain blockage due to aggressive scaling of semiconductor devices. Specifically, the source and drain areas of MOSFET circuits are becoming increasingly smaller, which can lead to blockage of the source and drain areas by spacers. Spacers are necessary components of MOSFET circuits, which function to isolate gate contact and source and drain contacts. In addition, spacers also passivate sidewalls of gate stacks. However, spacers are not always useful and in some cases have disadvantages. For example, the gate stacks are often used as contact lines to connect different devices. Spacers on the contact lines can increase the difficulty forming contact between the contact lines and the devices needed to contact. Moreover, these undesirable spacers occupy space and then reduce density of ICs. This increases the costs of manufacturing of ICs. Therefore, it is readily apparent that there is a need for a structure, method, etc. for making high density MOSFET circuits with different height contact lines, wherein spacer blockage of contact areas is avoided. In this case, undesirable spacers can be avoided to save space or reduce costs for IC design.

SUMMARY OF THE INVENTION

Embodiments herein present a structure, method, etc. for making high density MOSFET circuits with different height contact lines. The MOSFET circuits comprise a contact line, a first gate layer situated proximate the contact line, and at least one subsequent gate layer situated over the first gate layer. The contact line comprises a height that is less than a combined height of the first gate layer and the subsequent gate layer(s). The MOSFET circuits further comprise gate spacers situated proximate the gate layers and a single small contact line spacer (or potentially no contact line spacer) situated proximate the contact line. The gate spacers are taller and thicker than the contact line spacer.

The method for making the MOSFET circuits comprises forming a gate by forming a first gate layer and forming at least one subsequent gate layer over the first gate layer. Moreover, a contact line is formed during the formation of the first gate layer; i.e., the contact line and the first gate layer are formed simultaneously. Specifically, the gate and contact line can be formed by patterning a polysilicon layer for the contact line and the gate, and subsequently protecting the gate. Then, a doped portion is created by doping the contact lines to a desired height for the contact line, wherein the doped portion is subsequently etched.

The gate and contact line can be alternatively formed by depositing a first polysilicon layer over a substrate, depositing a silicon germanium layer over the first polysilicon layer, and depositing a second polysilicon layer over the silicon germanium layer. Next, the first polysilicon layer, the silicon germanium layer and the second polysilicon layer are patterned to produce a contact line stack and a gate stack. Following this, the gate stack is protected and the second polysilicon and silicon germanium layers are removed from the contact line stack. Thus, the contact line is formed proximate to the gate, wherein the contact line is shorter than the gate.

Next, the method forms first spacers proximate the gate and second spacers proximate the contact line, wherein the second spacers are shorter and thinner than the first spacers. Subsequently, one of the spacers is removed from the second spacers by protecting a preserved spacer from the second spacers, protecting the first spacers, and etching the MOSFET circuit.

Accordingly, embodiments of the invention provide a structure and method for making high density MOSFET circuits with different height contact lines. Specifically, lower contact lines are used to reduce both spacer height and spacer thickness. This reduces the chance of spacers blocking via hole etching. Since spacers on polysilicon contact lines can block via contacts, the via contacts can be separated from the source/drain areas of the MOSFET circuit. For example, spacer blocking causes circuit opens in static random access memory (SRAM). This problem is intensified as SRAM areas continue to shrink. Therefore, the structure and method of embodiments of the invention provide a solution that is easy to integrate into conventional processes of MOSFET manufacturing.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
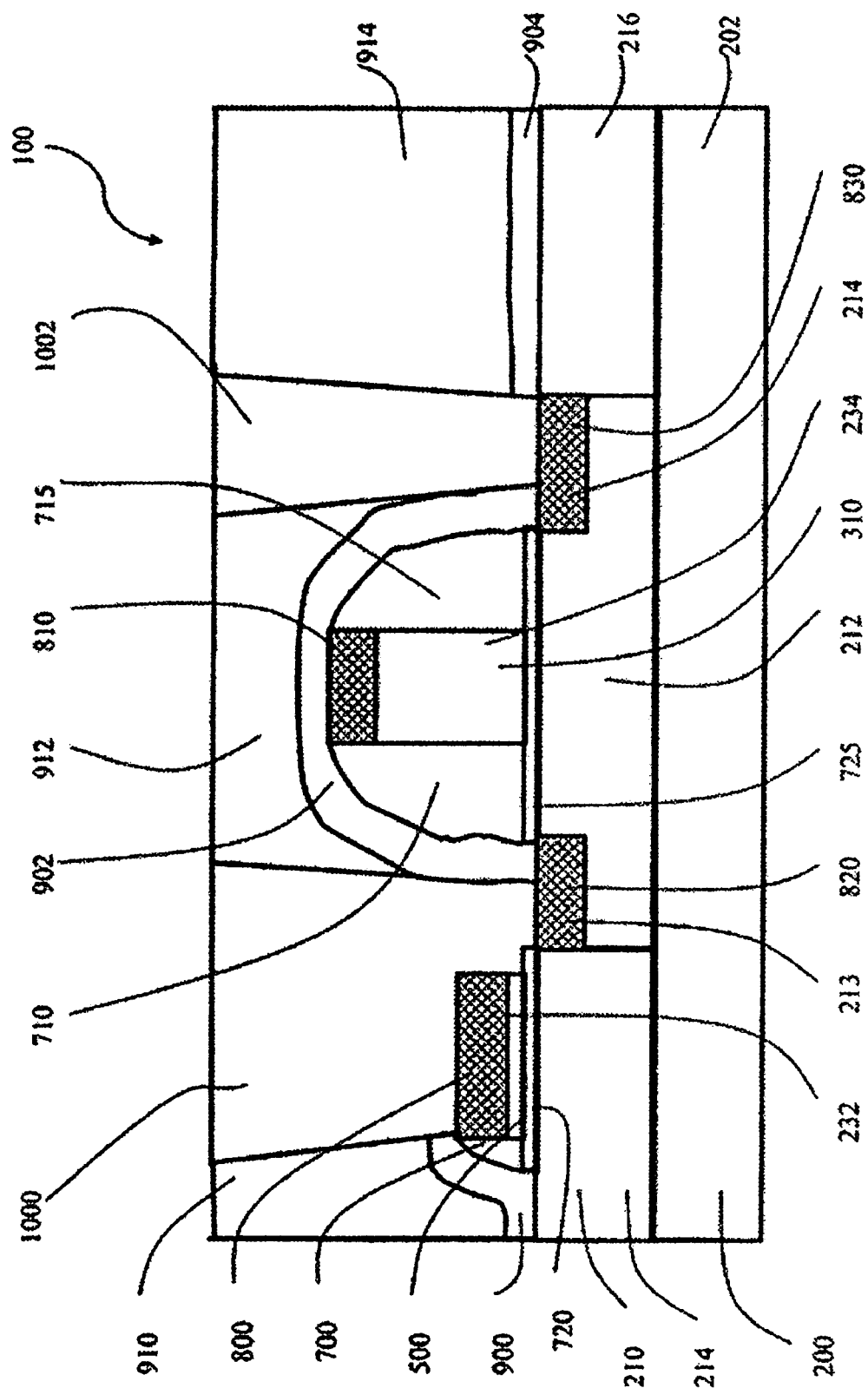
FIG. 1 is a schematic diagram illustrating a MOSFET circuit of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Embodiments of the invention provide a structure and method for making high density MOSFET circuits with different height contact lines. Specifically, lower contact lines are used to reduce both spacer height and spacer thickness. This reduces the chance of spacers blocking via hole etching and increases the density of ICs. Since spacers on polysilicon contact lines can block via contacts, the via contacts can be separated from the source/drain areas of the MOSFET circuit. For example, spacer blocking causes circuit opens in static random access memory (SRAM). This problem is intensified as SRAM areas continue to shrink. Therefore, the structure and method of embodiments of the invention provide a solution that is easy to integrate into conventional processes of MOSFET manufacturing.

More specifically, FIG. 1 illustrates a MOSFET circuit 100 comprising a first layer 200 positioned below a second layer 210, wherein the first layer 200 comprises silicon oxide (for SOI substrate) or silicon (for bulk substrate) 202, and wherein the second layer 210 comprises silicon 212. The silicon 212 comprises a first upper notch 213 and a second upper notch 214. The second layer 210 also comprises a source 820, a drain 830, and shallow trench isolation (STI) oxide members 214, 216. The source 820 and drain 830 are formed from highly doped Si and silicided, and they are situated within the first upper notch 213 and the second upper notch 214, respectively, of the silicon 212. A first STI oxide member 214 is situated proximate the source 820 and over the first layer 200; and, a second STI oxide member 216 is situated proximate the drain 830 and over the first layer 200.

Figure 19:
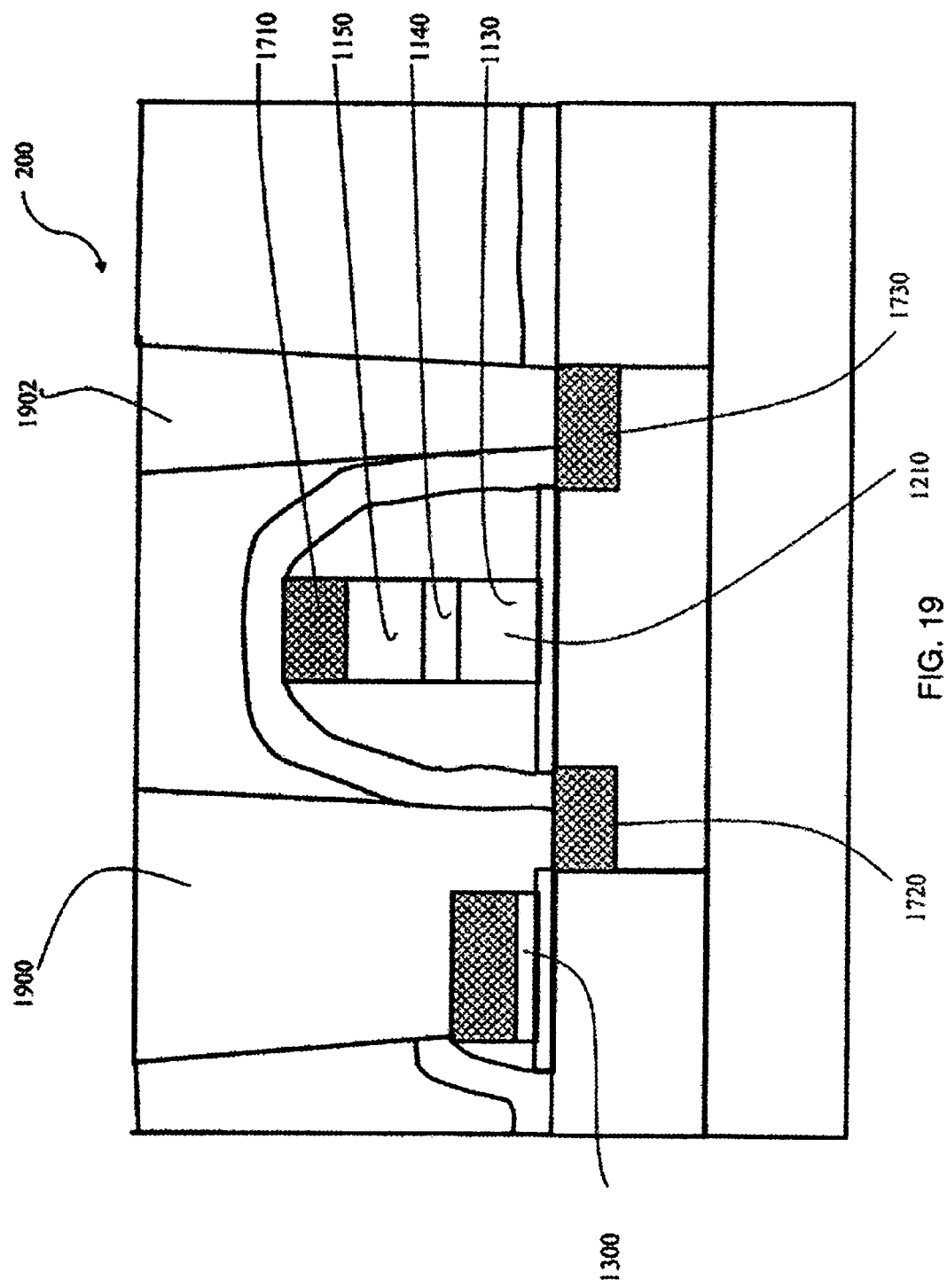
FIG. 19 is a schematic diagram illustrating a method step of the invention.

Embodiments of the invention further comprise a gate 310; a contact line 500; gate spacers 710, 715; a single contact line spacer 700; and gate dielectrics 720, 725. Specifically, the gate 310 is situated over the silicon 212 and between the source 820 and the drain 830, and the contact line 500 is situated over the first STI oxide member 214. The gate 310 comprises a silicide layer 810 situated over a polysilicon layer 234. In an alternative embodiment of the invention, a gate 1210 could comprise a first polysilicon layer 1130 situated below a polysilicon germanium layer 1140, a second polysilicon layer 1150 situated over the polysilicon germanium layer 1140, and a silicide layer 1710 situated over the second polysilicon layer 1150 (FIG. 19). The contact line 500 also comprises a silicide layer 800 situated over a polysilicon layer 232 (there is a possibility of no silicide layer 800 if the contact line is fully silicided); however, the contact line 500 comprises a height that is less than the height of the gate 310.

The gate spacers 710, 715 and the contact line spacer 700 are formed from nitride, wherein the gate spacers 710, 715 are situated proximate the gate 310. The contact line spacer 700 is situated proximate the contact line 500, on a side of the contact line 500 that is farthest from the gate 310. Because the contact line 500 is shorter than the gate 310, the contact line spacer 700 is shorter and thinner (if the spacer is over etched during spacer formation, this spacer may disappear) than each of the gate spacers 710, 715. Moreover, in addition to the decreased size of the contact line spacer 700, the MOSFET circuit 100 only comprises a single spacer or no spacer for the contact line, which may prevent spacer blockage of the source 820 and the drain 830. Furthermore, a first gate dielectric 725 is situated between the gate 310 and the silicon 212; and, a second gate dielectric 720 is situated between the contact line 500 and the first STI oxide member 214.

Embodiments of the invention further comprise dielectric members 900, 902, 904; low-k dielectric members 910, 912, 914; and metal vias 1000, 1002. Specifically, the dielectric members 900, 902, 904 are formed from nitride, wherein a first dielectric member 900 is situated over the contact line spacer 700 and over the first STI oxide member 214. A second dielectric member 902 is situated over the gate 310; over the gate spacers 710, 715; and, over portions of the source 820 and the drain 830. Further, a third dielectric member 904 is situated over the second STI oxide member 216.

Moreover, the low-k dielectric members 910, 912, 914 are formed from oxide. Specifically, a first low-k dielectric member 910 is situated over the first dielectric member 900; a second low-k dielectric member 912 is situated over the second dielectric member 902; and, a third low-k dielectric member 914 is situated over the third dielectric member 904. The metal vias 1000, 1002 are formed from tungsten. Specifically, a first metal via 1000 is situated between the first low-k dielectric member 910 and the second low-k dielectric member 912; and, a second metal via 1002 is situated between the second low-k dielectric member 912 and the third low-k dielectric member 914. Moreover, the first metal via 1000 is situated over the contact line 500 and over a portion of the source 820; and, the second metal via 1002 is situated over a portion of the drain 830. Another tungsten via (not shown) could be formed over the gate for gate metal contact as in conventional devices.

Figure 2:
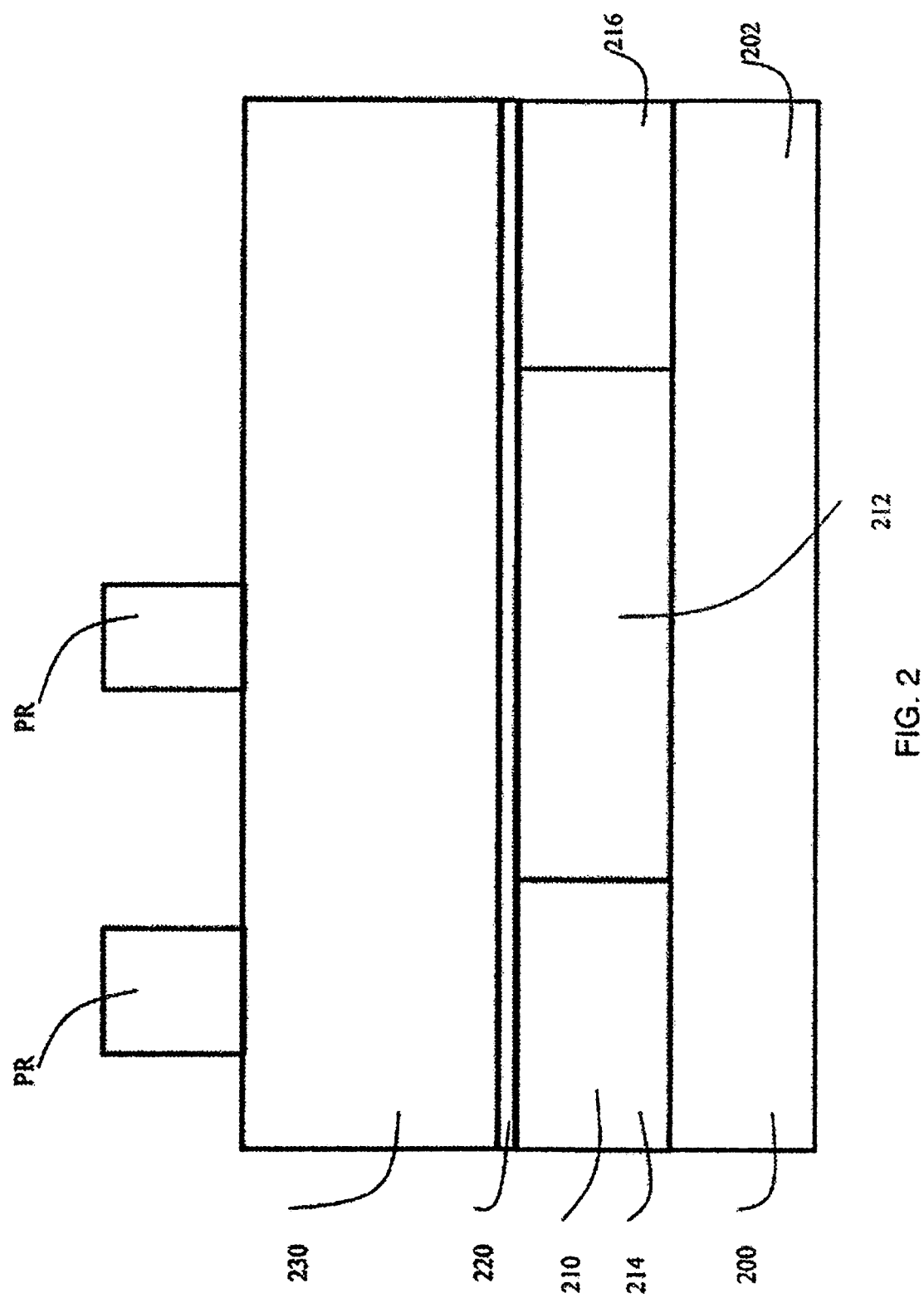
FIG. 2 is a schematic diagram illustrating a method step of the invention.

Referring to FIG. 2, embodiments of the invention also provide a method for making the MOSFET circuit 100, comprising forming a silicon-on-insulator (SOI) or bulk device, wherein the second layer 210 is formed over the first layer 200, wherein the second layer 210 comprises silicon 212, and wherein the first layer 200 comprises silicon oxide (for SOI) or silicon (for bulk) 202. Following this, the method forms the STI oxide members 214, 216 on opposing edges of a silicon member 212 in second layer 210. Specifically, a pad oxide is deposited, followed by nitride, wherein the nitride is patterned with a photoresist. Next, reactive ion etching (RIE) is performed on the nitride and the photoresist is removed. Further, the oxide is etched, followed by etching of the silicon, and liner oxidation is performed as needed. Oxide is then refilled and polished via chemical mechanical polishing (CMP), wherein the polishing is stopped at the nitride. Subsequently, the nitride is etched and some of the oxide is time etched.

Figure 3:
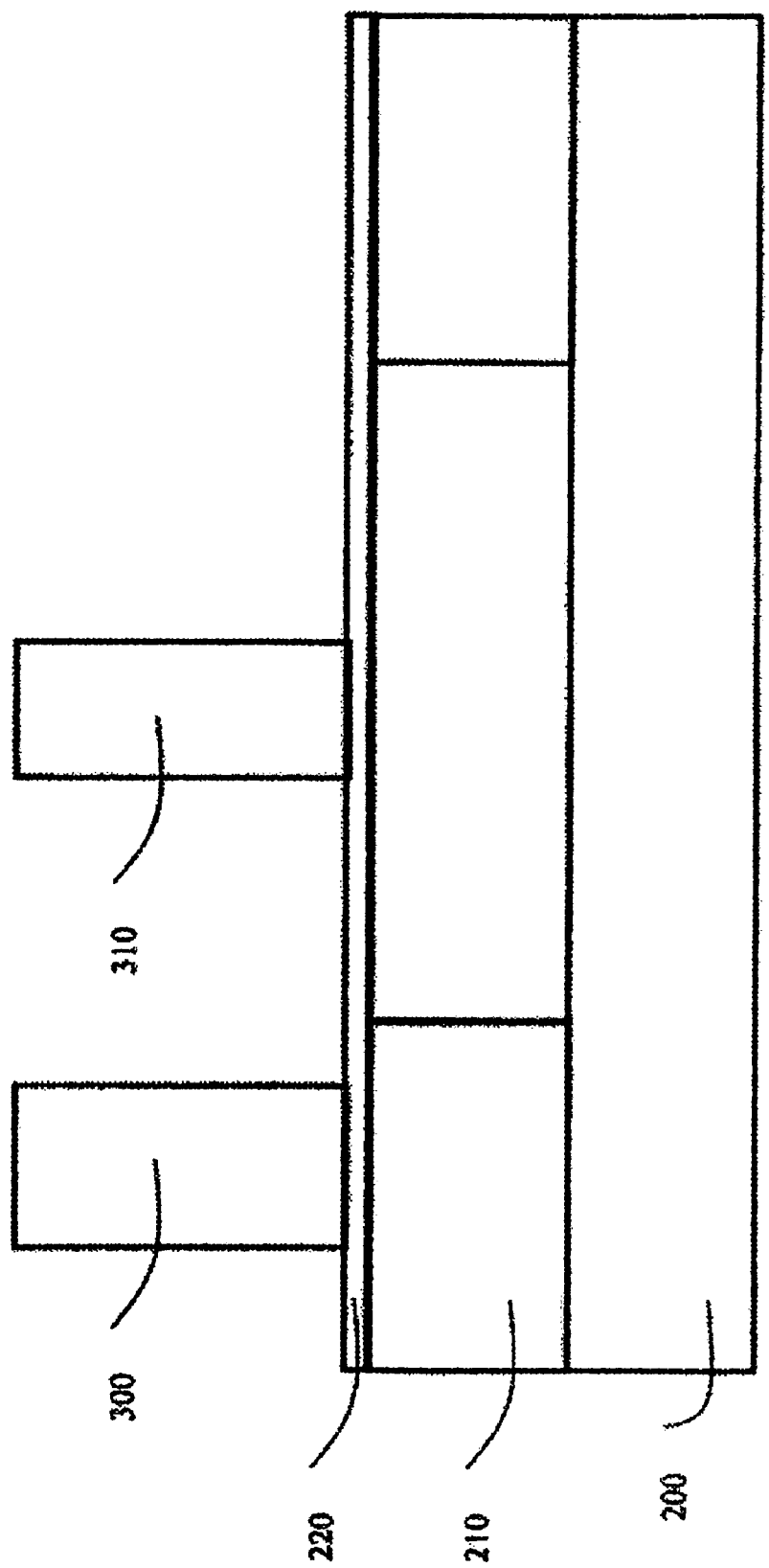
FIG. 3 is a schematic diagram illustrating a method step of the invention.
Figure 4:
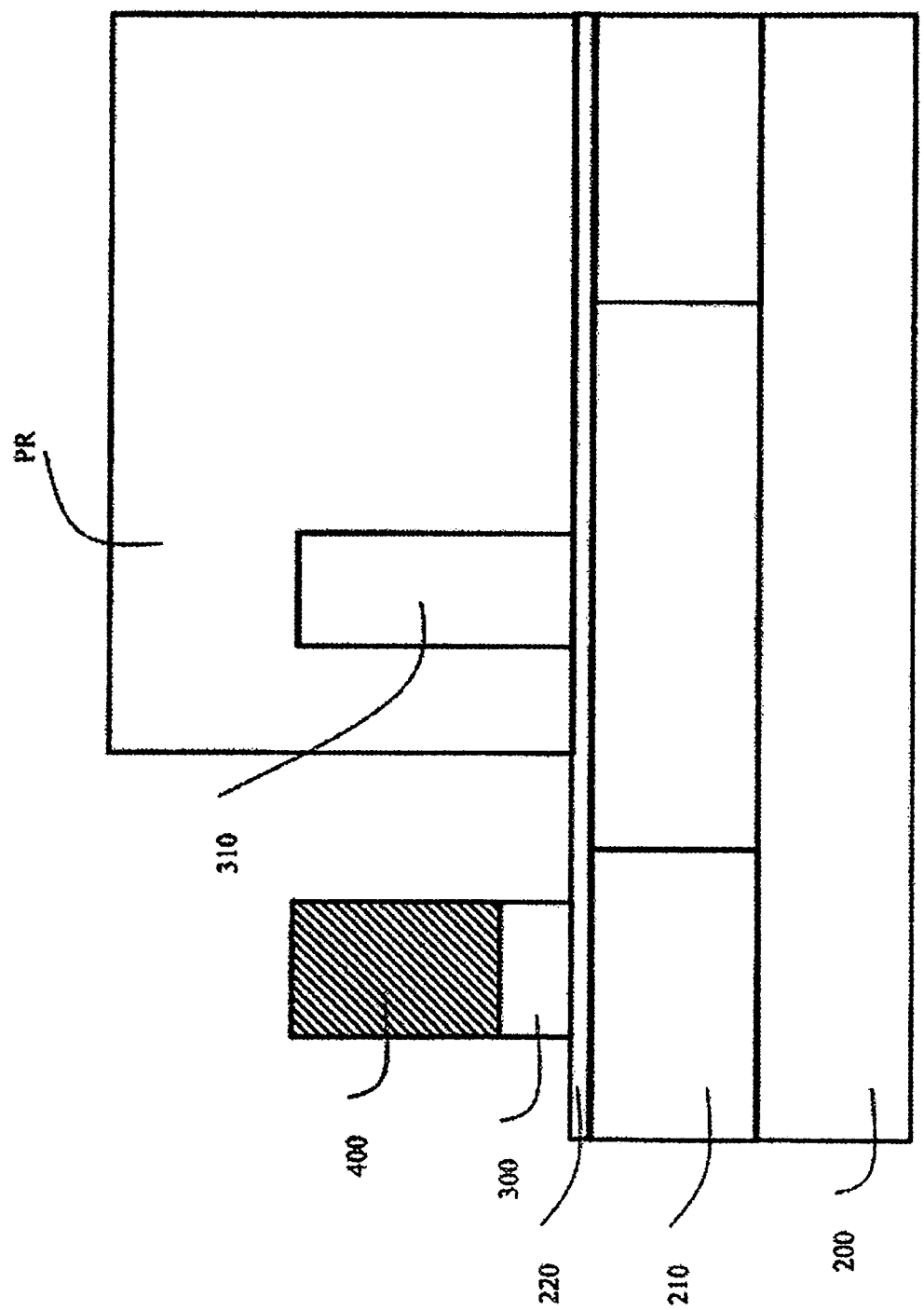
FIG. 4 is a schematic diagram illustrating a method step of the invention.
Figure 5:
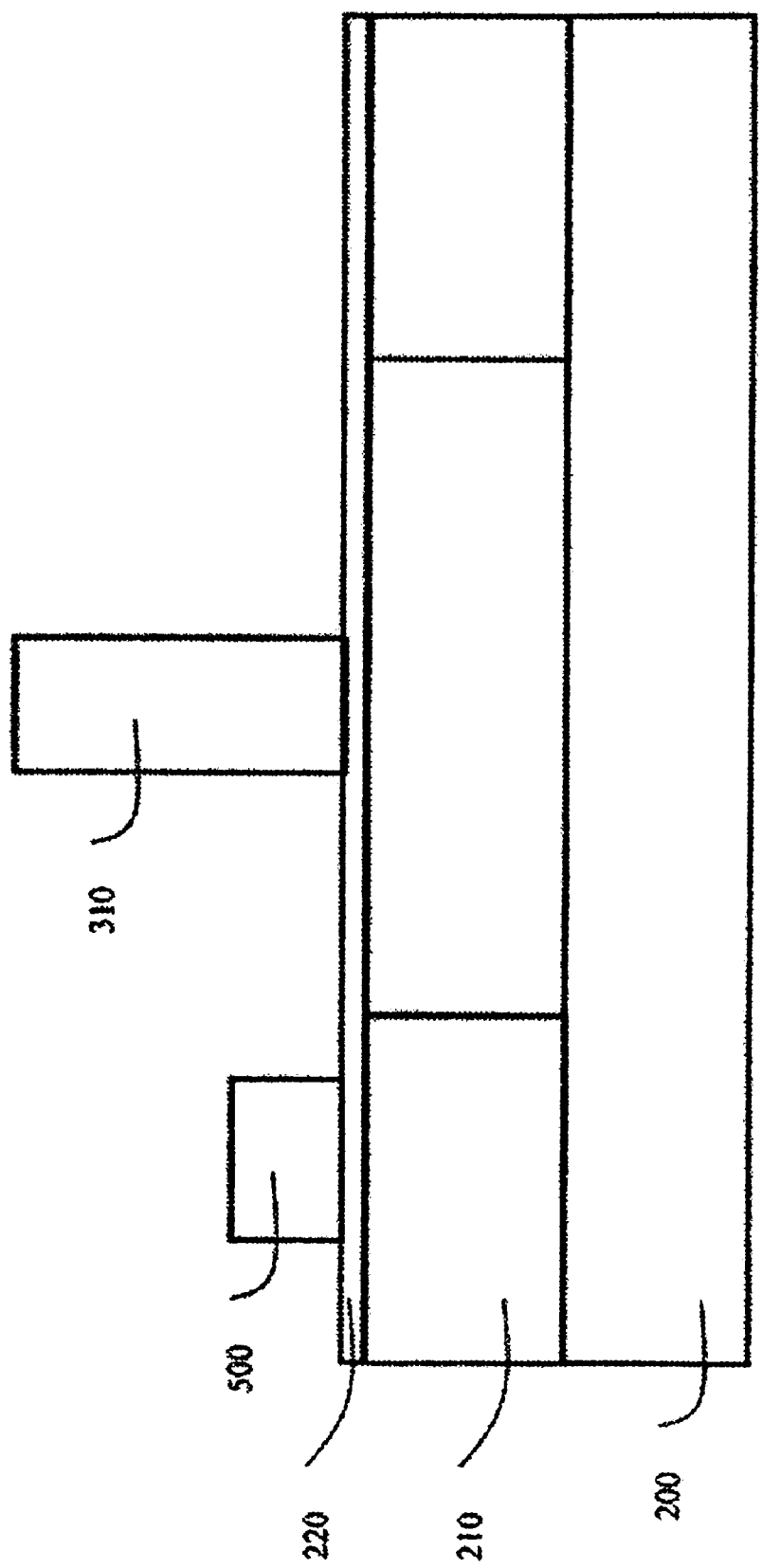
FIG. 5 is a schematic diagram illustrating a method step of the invention.

Following formation of the STI oxide members 214, 216, the method forms a gate dielectric layer 220 by depositing a high-k material over the second layer 210. A polysilicon layer 230 is then formed over the gate dielectric layer 220, wherein the polysilicon layer 230 has a thickness between 60 and 150 nm. Next, a contact line photoresist PR and a gate photoresist PR are placed over the polysilicon layer 230 to pattern a contact line and a gate (FIG. 2), wherein a printed circuit landing pad 300 and a gate 310 are subsequently formed via reactive ion etching of portions of the polysilicon layer 230 (FIG. 3). The method then removes the contact line photoresist PR and the gate photoresist PR, implants a germanium layer 400 over the printed circuit landing pad 300 to dope the polysilicon, and places a second gate photoresist PR over the gate 310 (FIG. 4). Subsequently, the contact line 500 is formed by removing the germanium layer 400 via reactive ion etching and removing the second gate photoresist PR (FIG. 5). Following this conventional processing may be performed to conduct extension and halo implantation to form doped extension and to adjust threshold voltage of the MOSFET.

Figure 6:
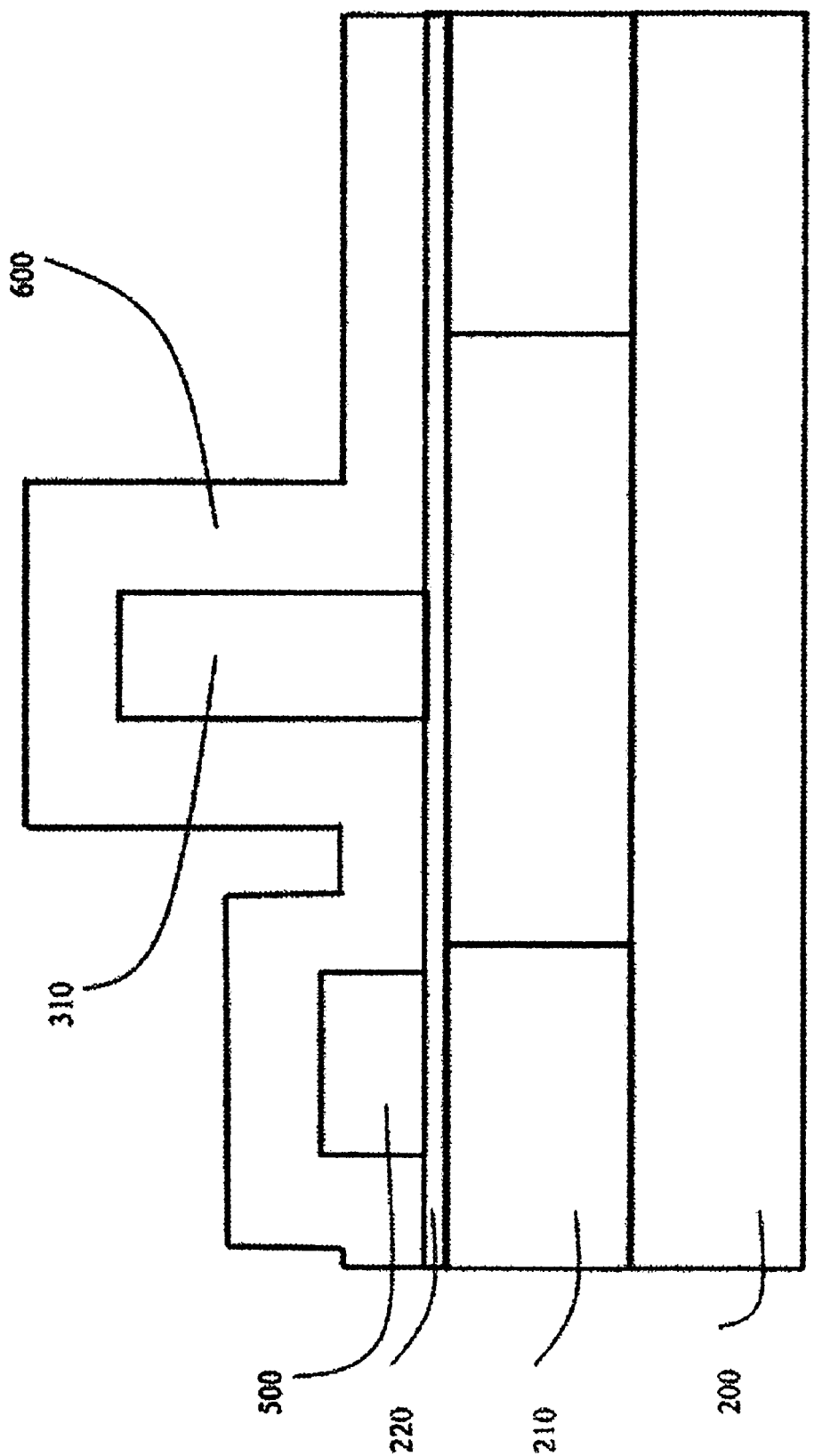
FIG. 6 is a schematic diagram illustrating a method step of the invention.
Figure 7:
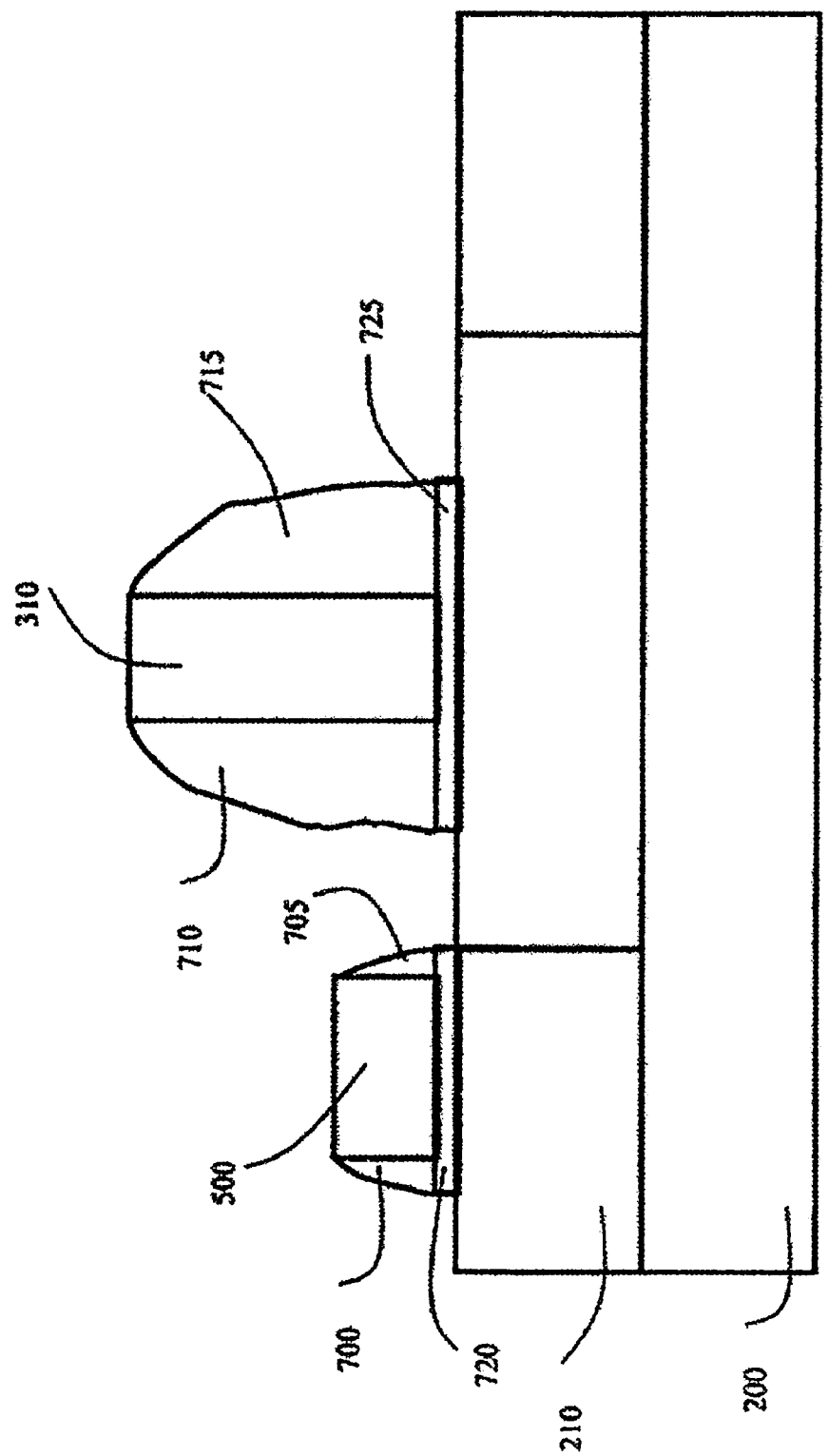
FIG. 7 is a schematic diagram illustrating a method step of the invention.

Following this, a nitride layer 600 is deposited over and around the contact line 500 and the gate 310 (FIG. 6), wherein portions of the nitride layer 600 and portions of the gate dielectric layer 220 are subsequently etched to form contact line spacers 700, 705; gate spacers 710, 715; and gate dielectrics 720, 725. As illustrated in FIG. 7, the height of the contact line 500 is less than the height of the gate 310; and thus, the contact line spacers 700, 705 are shorter and thinner than the gate spacers 710, 715. Next, silicide layers 800, 810, 820 and 830 are formed within a top portion (fully silicided contact line also works) of the contact line 500, within a top portion of the gate 310, and within top portions of the silicon 212 proximate the gate spacers 710, 715 (i.e., the source 820 and the drain 830), respectively. Before silicide layers 800, 810, 820 and 830 are formed, source/drain ion implantation and source/drain annealing are conducted, as is commonly known within the art. Silicide layers are formed by conventional processes: depositing metal, annealing, and wet etching unreacted metal. Furthermore, a conventional back end of line (BEOL) process is performed by depositing a second nitride layer 840 over the gate 310 and over the contact line 500, depositing an oxide layer 850 over the second nitride layer 840, and performing chemical mechanical polishing.

Figure 8:
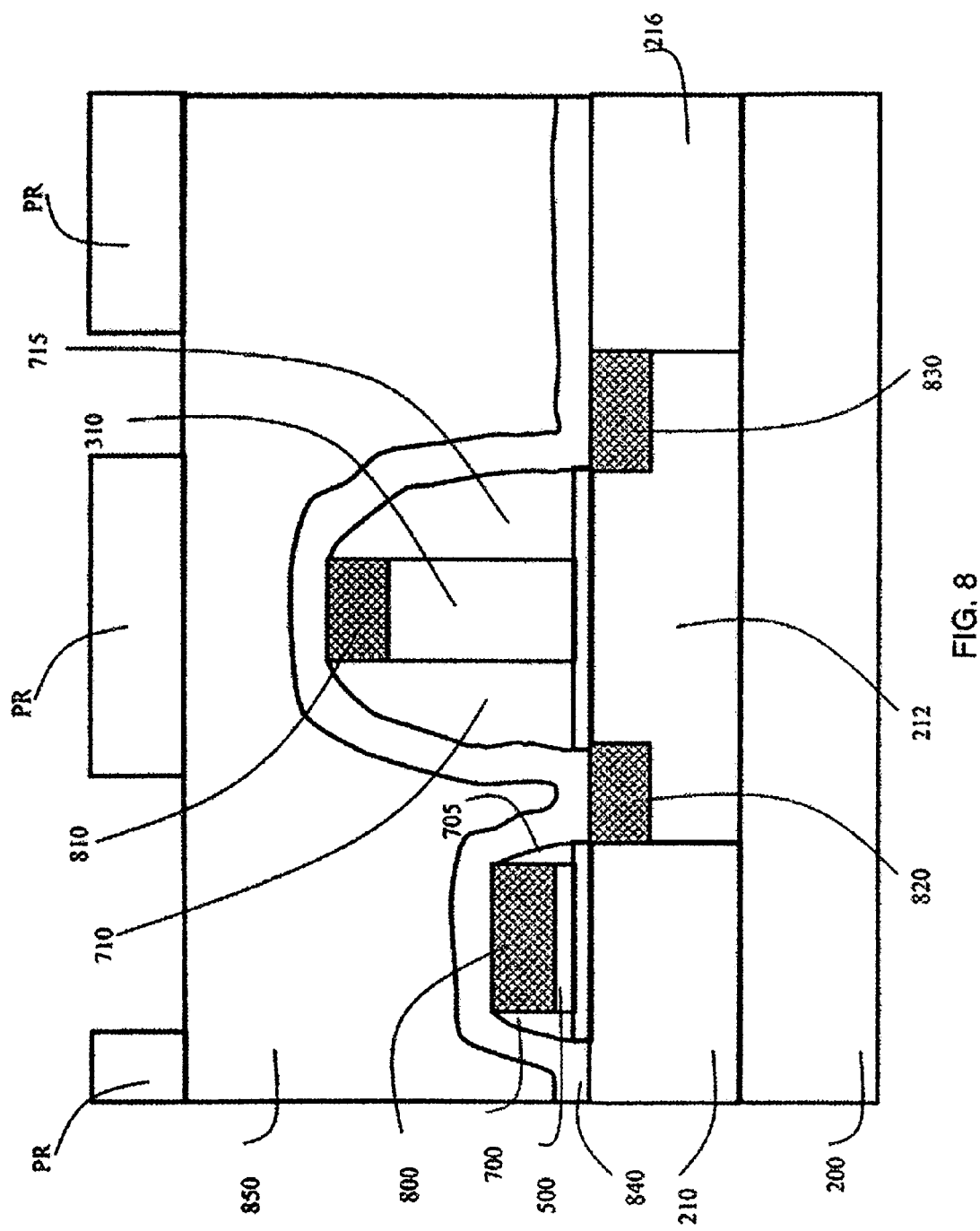
FIG. 8 is a schematic diagram illustrating a method step of the invention.
Figure 9:
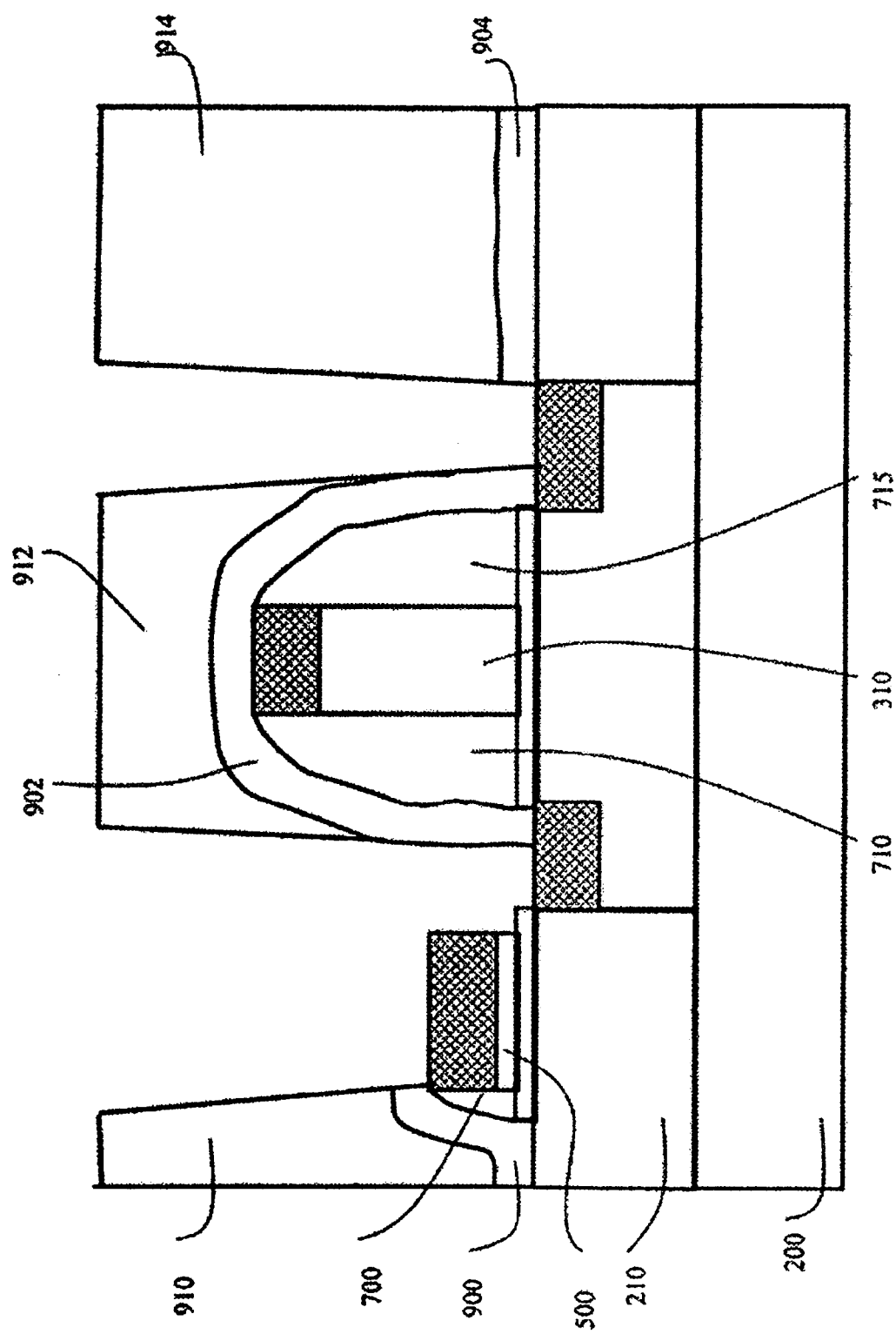
FIG. 9 is a schematic diagram illustrating a method step of the invention.
Figure 10:
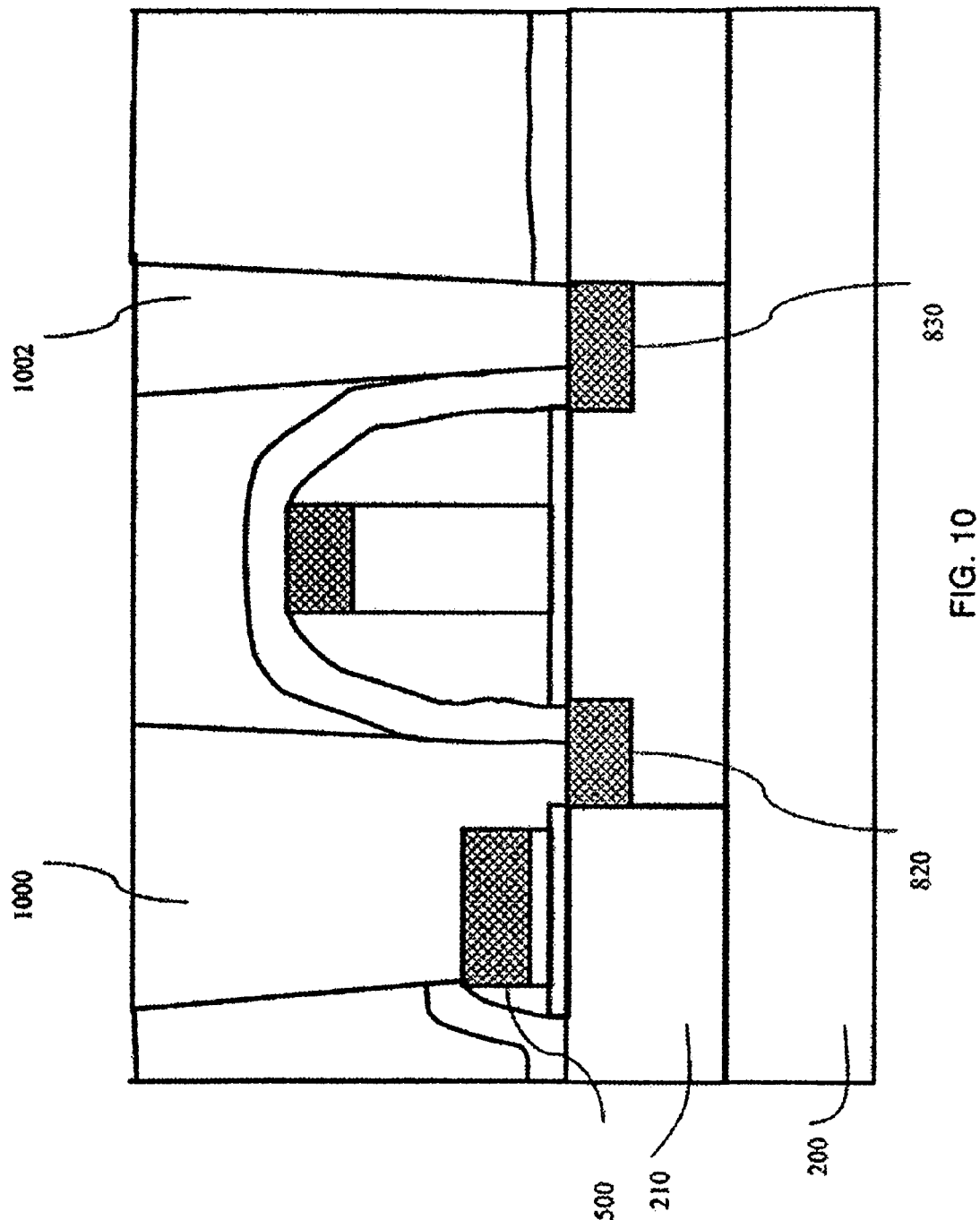
FIG. 10 is a schematic diagram illustrating a method step of the invention.

As illustrated in FIG. 8, the method then places a photoresist PR over the contact line spacer furthest from the gate 310 (i.e., contact line spacer 700); a photoresist PR over the gate 310 and over a portion of the gate spacers 710, 715; and, a photoresist PR over a portion of the STI oxide member of the second layer 210 that is farthest from the contact line 500 (i.e., second STI oxide member 216). Subsequently, reactive ion etching is performed, stopping at the second nitride layer 840, to form low-k dielectric members 910, 912, 914. Following this, the photoresists are removed and reactive ion etching is performed. Thus, portions of the second nitride layer 840 are removed to form dielectric members 900, 902, 904; and, the contact line spacer 705 is removed (FIG. 9). Because the contact line 500 is shorter than the gate 310, the nitride deposited on the contact line 500 and the contact line spacers 700, 705 are shorter and thinner than the nitride deposited on the gate 310 and the gate spacers 710, 715; and thus, portions of the nitride deposited on the contact line 500 and the contact line spacer 705 may be removed via reactive ion etching. Moreover, because the MOSFET circuit 100 only comprises a single contact line spacer (i.e., contact line spacer 700), spacer blockage of the source 820 and the drain 830 can be prevented. The method then forms metal vias 1000 and 1002 by depositing tungsten over the contact line 500 and over a portion of the source 820, and over a portion of the drain 830, respectively, followed by chemical mechanical polishing (FIG. 10). To reduce contact resistance, a thin layer of titanium nitride may be deposited over the contact line 500 and over portions of the source 820 and the drain 830 prior to tungsten deposition.

In another embodiment of the invention, a method for making a MOSFET circuit 200 begins by forming a silicon-on-insulator chip, wherein a second layer 1110 is formed over a first layer 1100, wherein the second layer 1110 comprises silicon 1112, and wherein the first layer 1100 comprises silicon oxide 1102. Following this, the method forms STI oxide members 1114, 1116 on opposing edges of a silicon member 1112 in second layer 1110. Specifically, pad oxide is deposited, followed by nitride, wherein the nitride is patterned with a photoresist. Next, reactive ion etching is performed on the nitride and the photoresist is removed. Further, the oxide is etched, followed by etching of the silicon, and liner oxidation is performed as needed. Oxide is then refilled and polished via chemical mechanical polishing, wherein the polishing is stopped at the nitride. Subsequently, the nitride is etched and some of the oxide is time etched.

Figure 11:
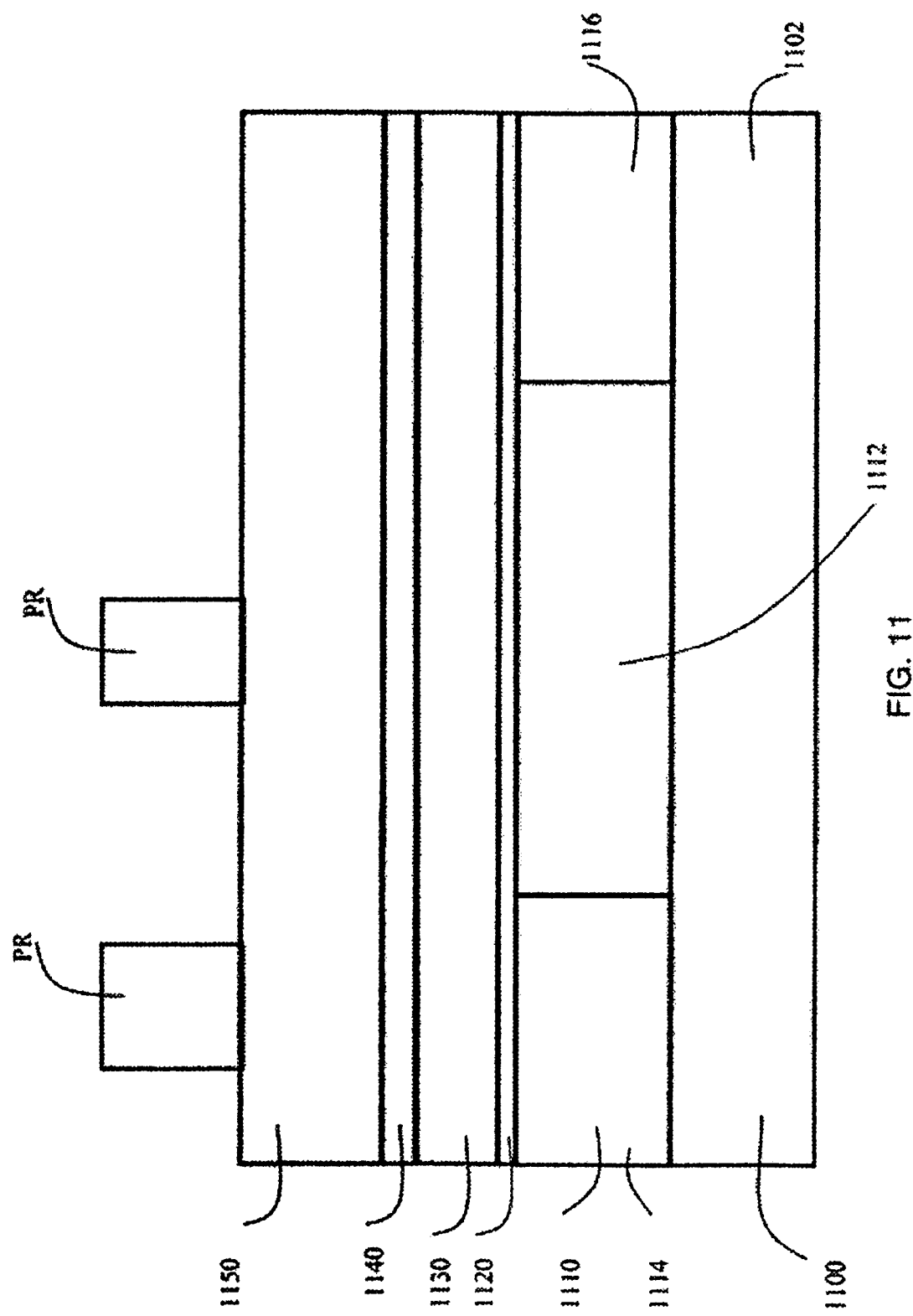
FIG. 11 is a schematic diagram illustrating a method step of the invention.
Figure 12:
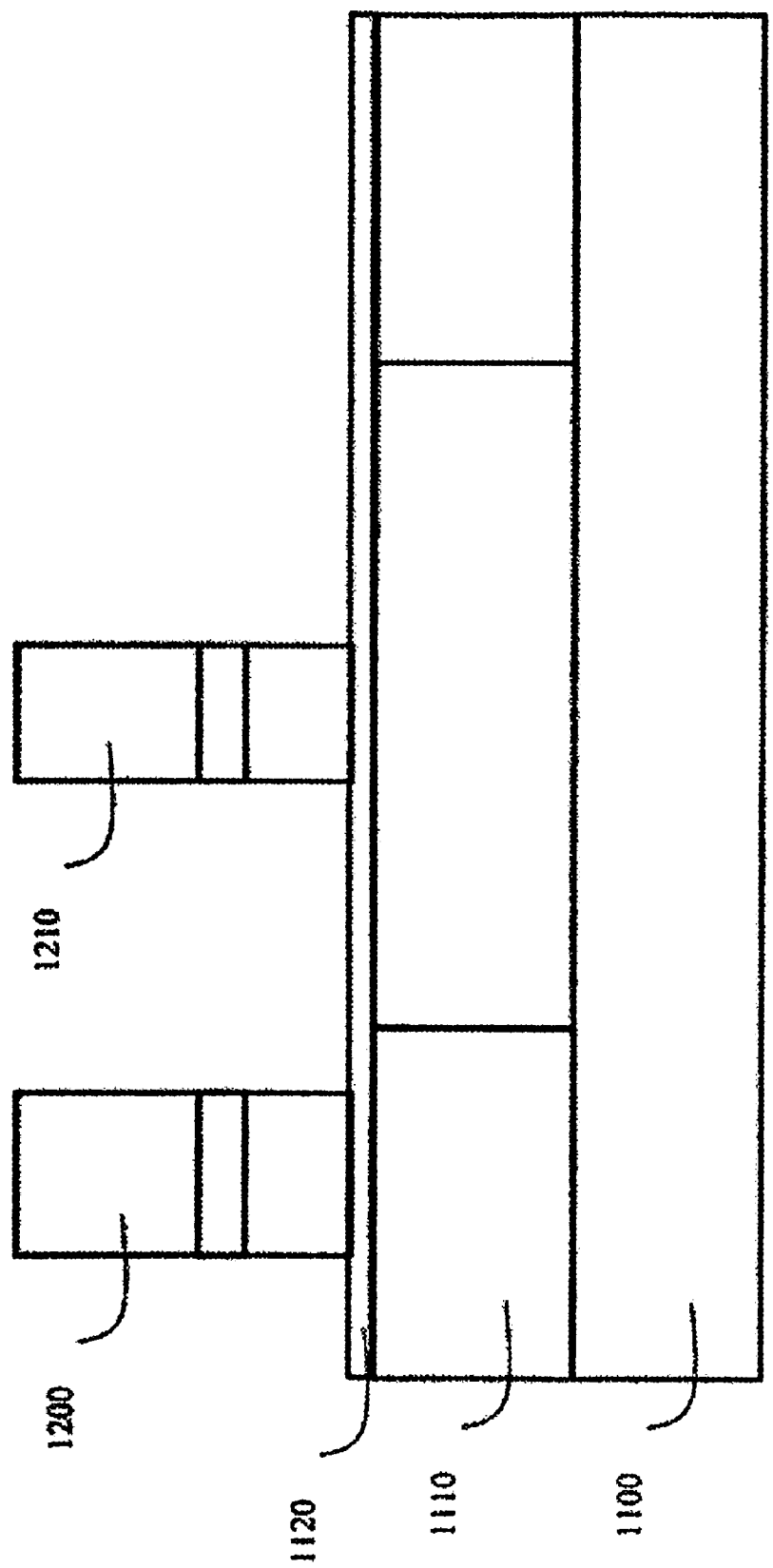
FIG. 12 is a schematic diagram illustrating a method step of the invention.
Figure 13:
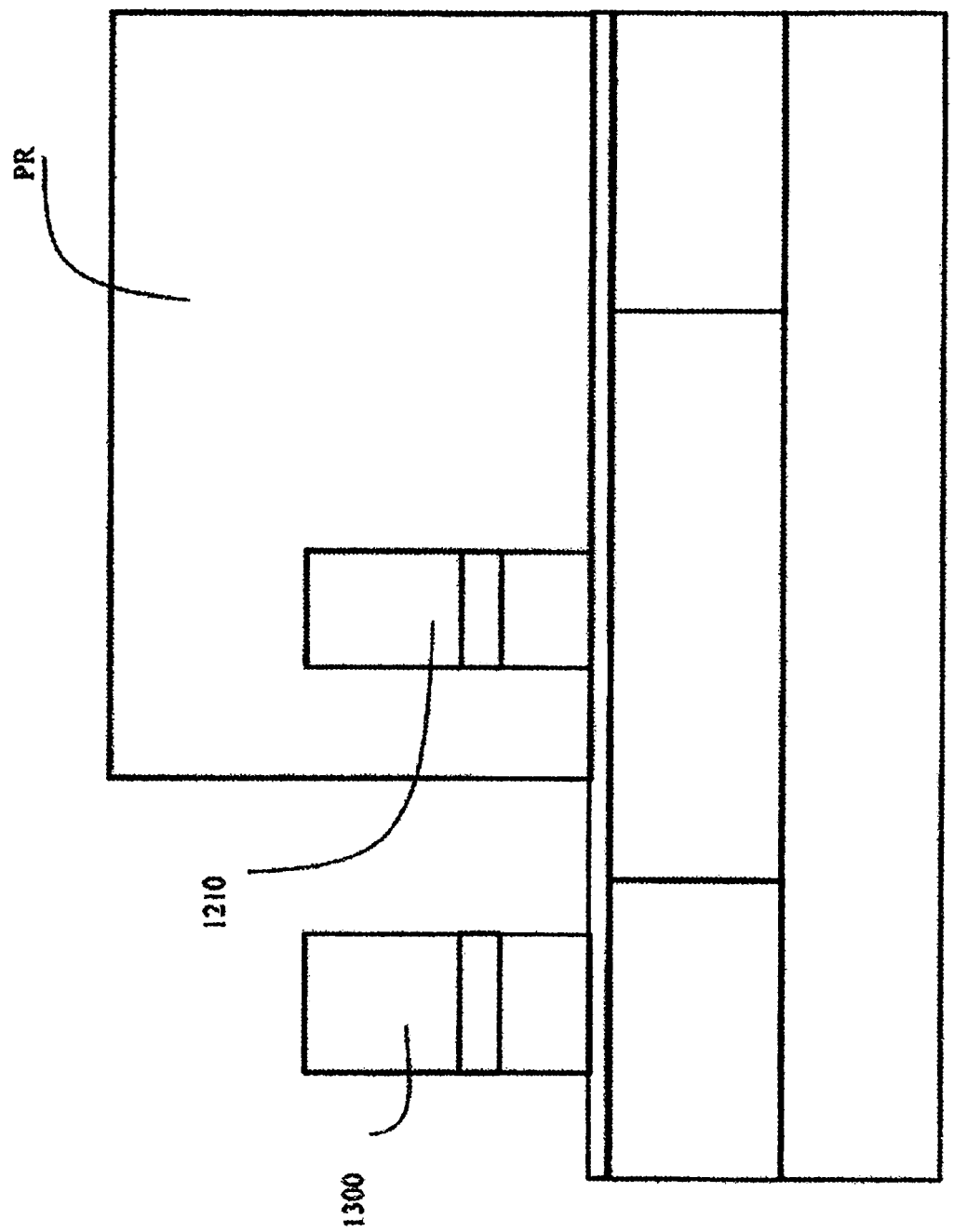
FIG. 13 is a schematic diagram illustrating a method step of the invention.
Figure 14:
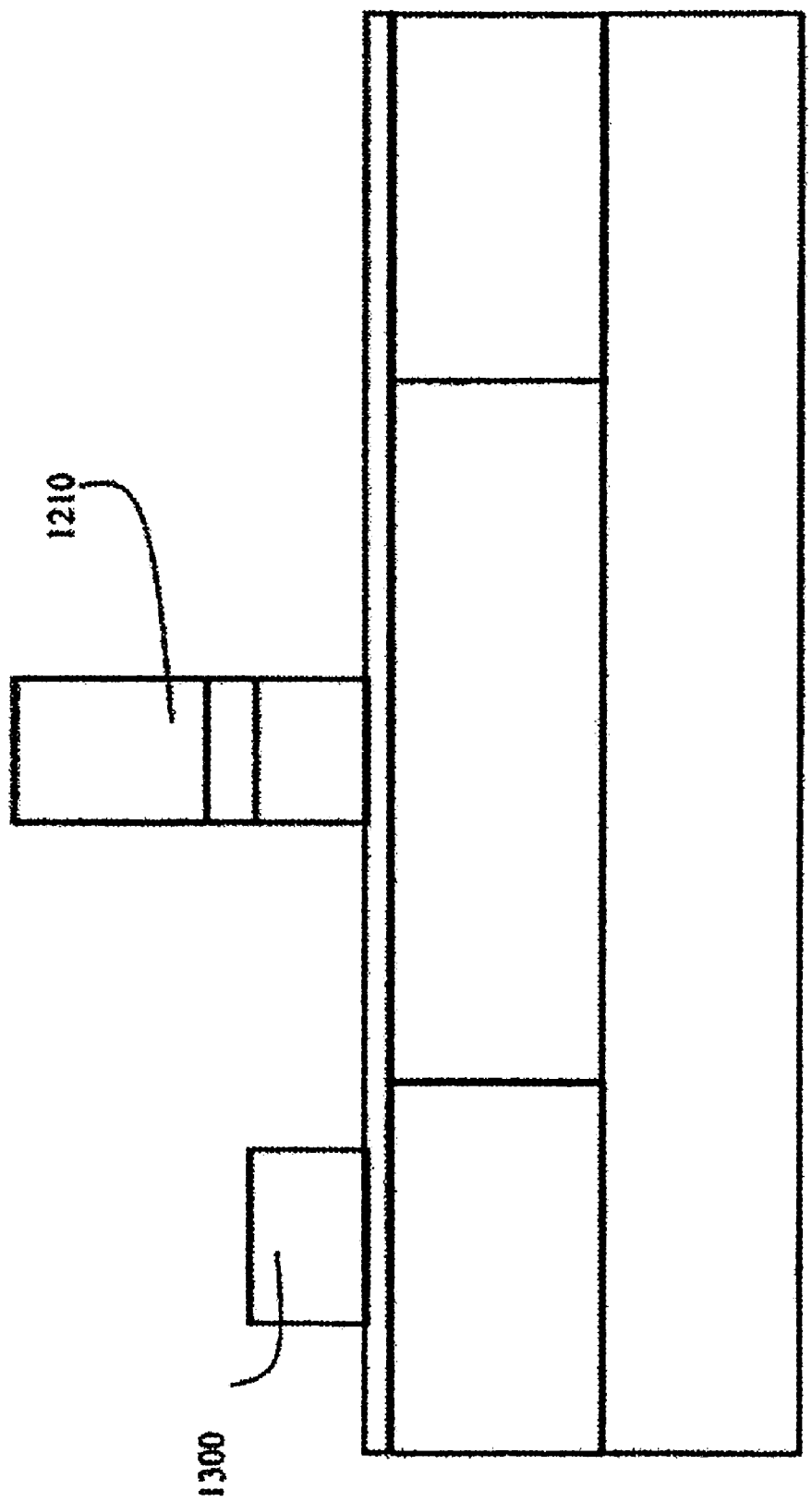
FIG. 14 is a schematic diagram illustrating a method step of the invention.

Following formation of the STI oxide members 1114, 1116, the method forms a gate dielectric layer 1120 by depositing a high-k material over the second layer 1110. A first polysilicon or metal layer 1130 is then formed over the gate dielectric layer 1120, followed by a polysilicon germanium layer 1140 and a second polysilicon layer 1150. The first polysilicon or metal layer 1130, the polysilicon germanium layer 1140, and the second polysilicon layer 1150 each have an exemplary thickness of 30-50 nm, 10 nm, and 40-80 nm, respectively. Next, a contact line photoresist PR and a gate photoresist PR are placed over the second polysilicon layer 1150 to pattern a contact line and a gate (FIG. 11), wherein a contact line stack 1200 and a gate 1210 are subsequently formed via reactive ion etching of portions of the first polysilicon/metal layer 1130, portions of the polysilicon germanium layer 1140, and portions of the second polysilicon layer 1150 (FIG. 12). The method then produces the contact line 1300 by removing the contact line photoresist PR and the gate photoresist PR, placing a second gate photoresist PR over the gate 1210 (FIG. 13), removing portions of the polysilicon germanium layer 1140 (if the first layer 1130 is metal, then the polysilicon germanium layer 1140 remains to protect the first layer 1130 during subsequent silicide formation) and portions of the second polysilicon layer 1150 from the contact line stack 1200 via reactive ion etching, and removing the second gate photoresist PR (FIG. 14). Following this, conventional processes are performed to conduct extension and halo implantation to form doped extension and to adjust the threshold voltage of the MOSFET.

Figure 15:
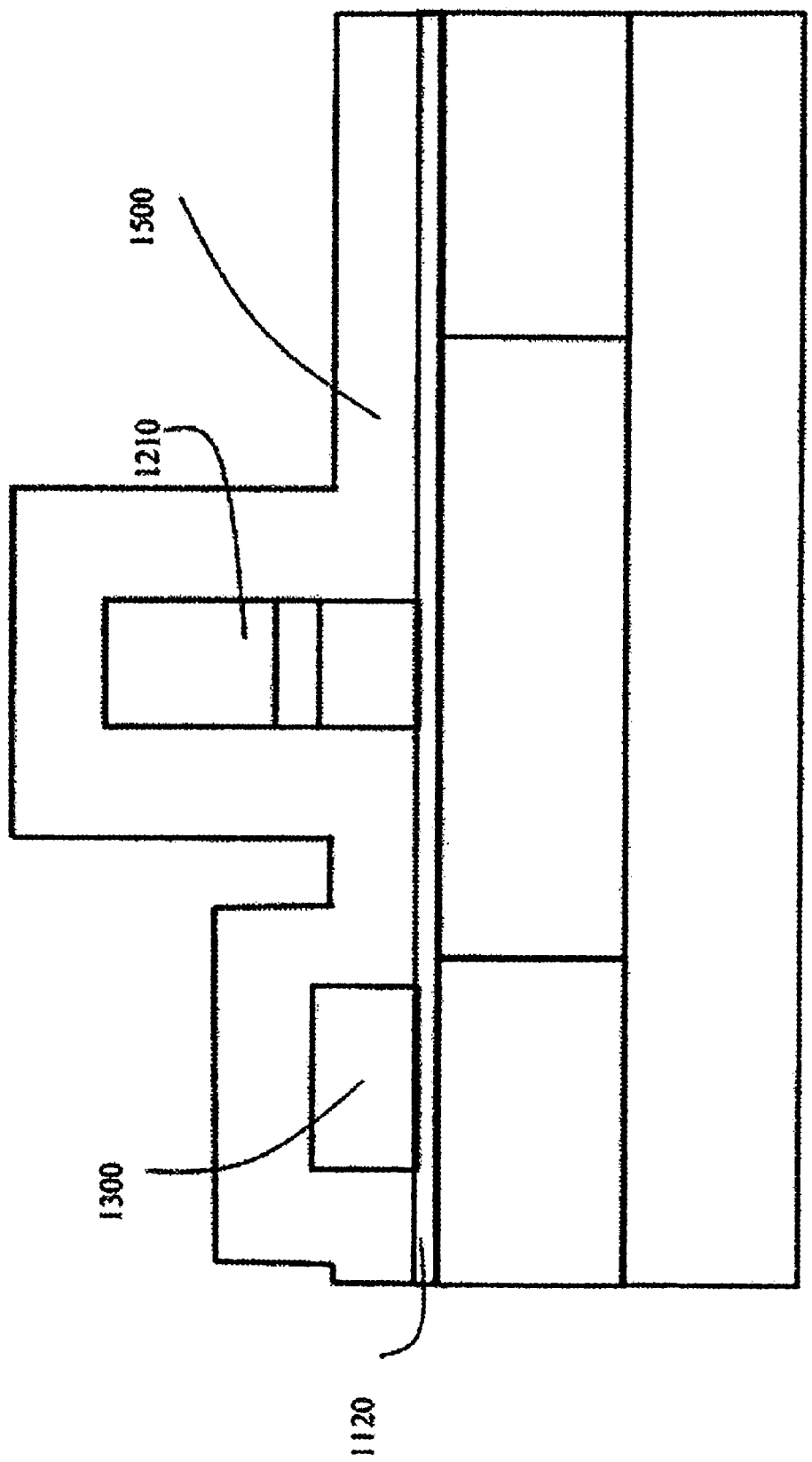
FIG. 15 is a schematic diagram illustrating a method step of the invention.
Figure 16:
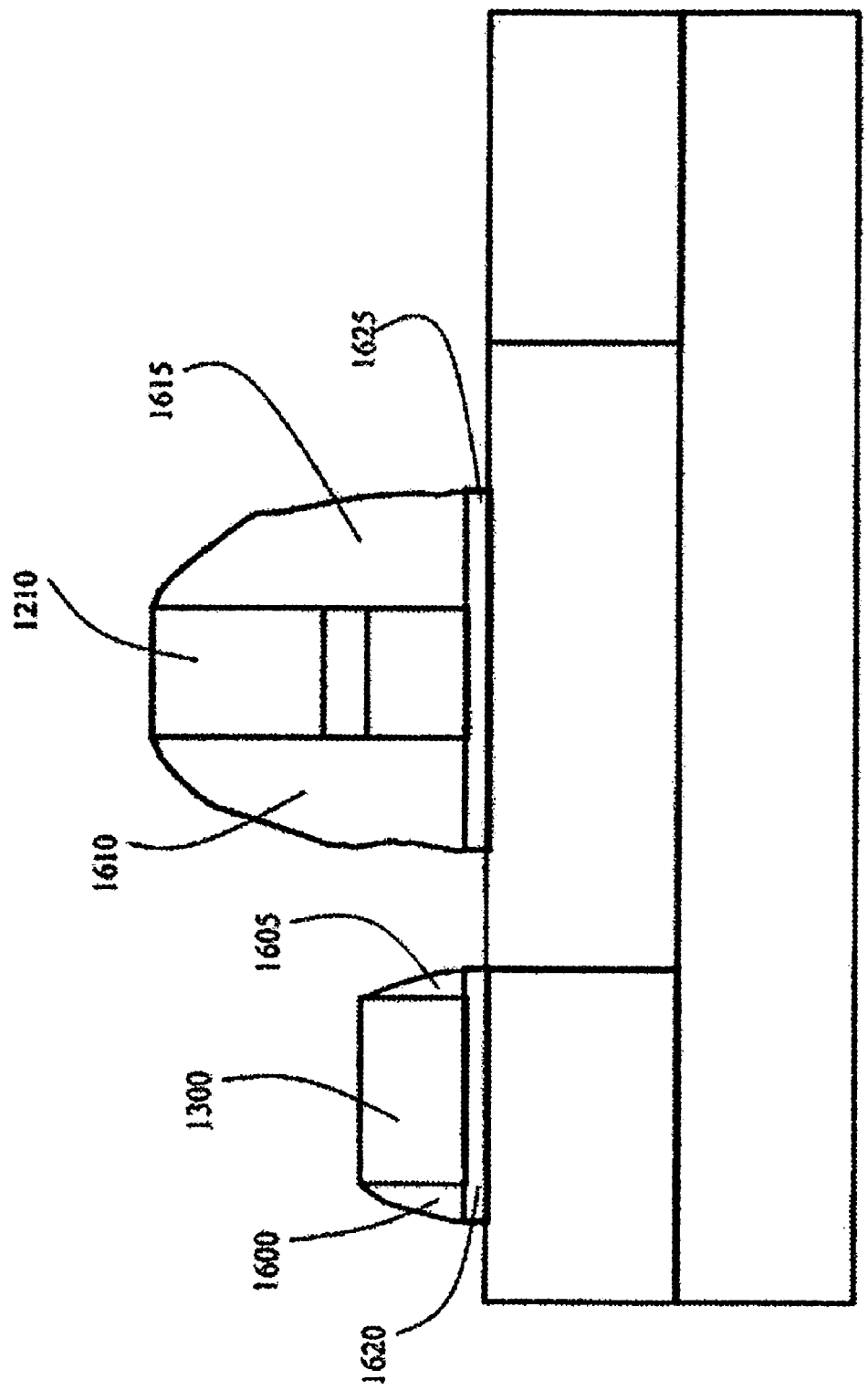
FIG. 16 is a schematic diagram illustrating a method step of the invention.

Following this, a nitride layer 1500 is deposited over and around the contact line 1300 and the gate 1210 (FIG. 15), wherein portions of the nitride layer 1500 and portions of the gate dielectric layer 1120 are subsequently etched to form contact line spacers 1600, 1605; gate spacers 1610, 1615; and gate dielectrics 1620, 1625. As illustrated in FIG. 16, the height of the contact line 1300 is less than the height of the gate 1210; and thus, the contact line spacers 1600, 1605 are shorter and thinner than the gate spacers 1610, 1615. Next, silicide layers 1700, 1710, 1720 and 1730 are formed within a top portion of the contact line 1300 (fully silicided contact line also works), within a top portion of the gate 1210, and within top portions of the silicon 1112 proximate the gate spacers 1610, 1615 (i.e., the source 1720 and the drain 1730), respectively. Before silicide layers 1700, 1710, 1720 and 1730 are formed, source/drain ion implantation and source/drain annealing are conducted, as is commonly known within the art. Silicide layers are formed by conventional processes: depositing metal, annealing, and wet etching unreacted metal. Furthermore, a conventional back end of line (BEOL) process is performed by depositing a second nitride layer 1740 over the gate 1210 and over the contact line 1300, depositing an oxide layer 1750 over the second nitride layer 1740, and performing chemical mechanical polishing.

Figure 17:
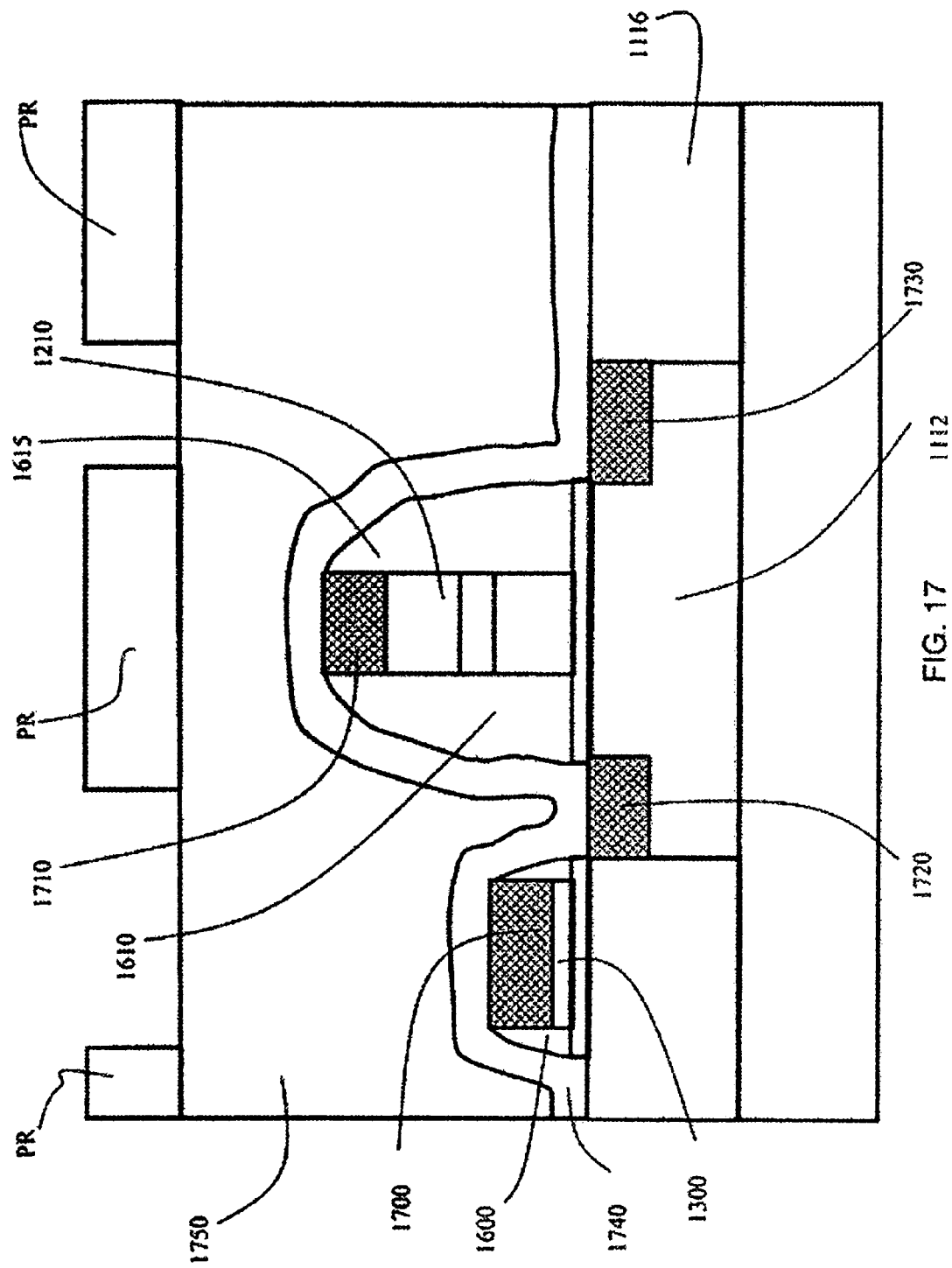
FIG. 17 is a schematic diagram illustrating a method step of the invention.
Figure 18:
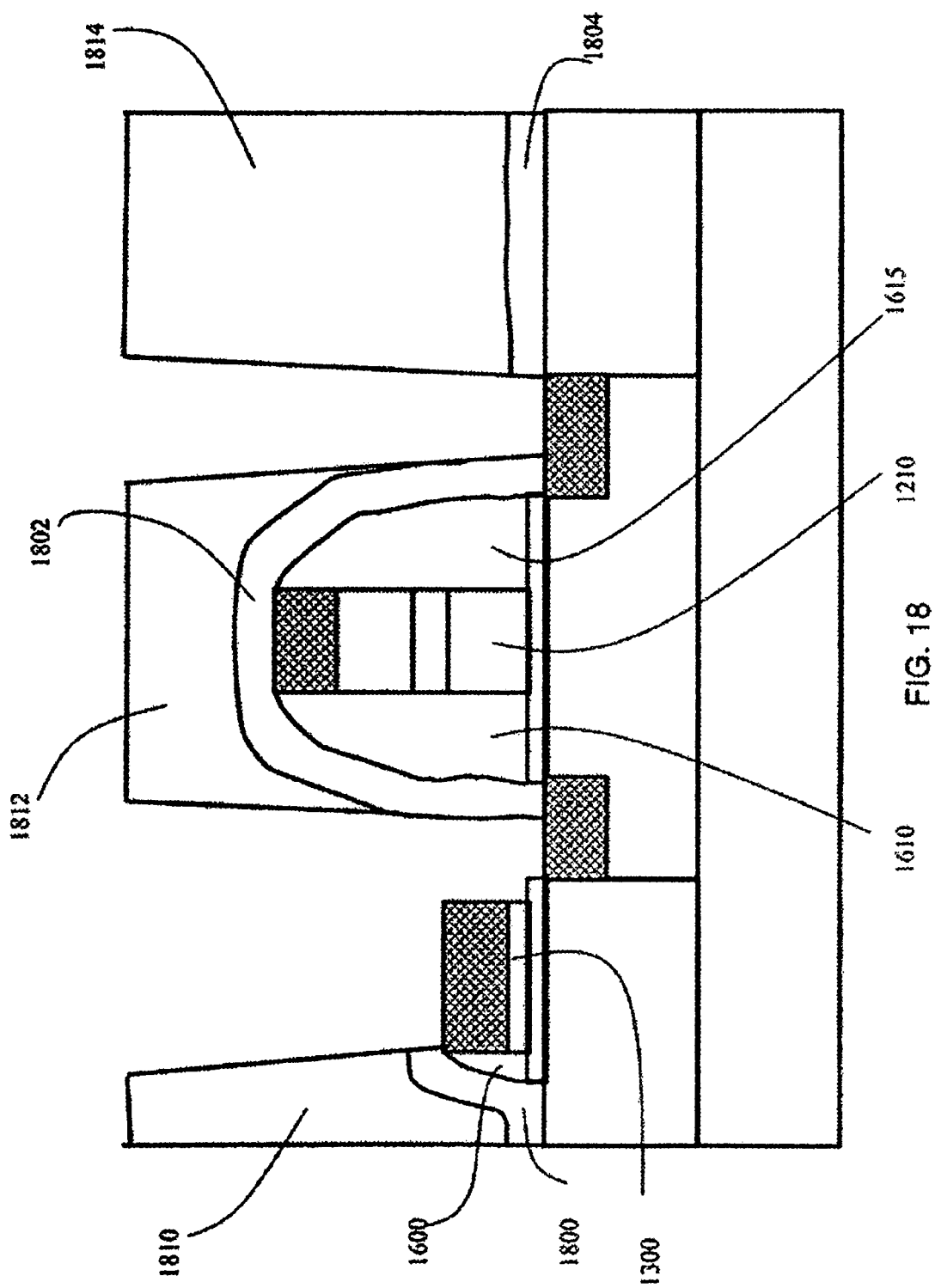
FIG. 18 is a schematic diagram illustrating a method step of the invention.

As illustrated in FIG. 17, the method then places a photoresist PR over the contact line spacer furthest from the gate 1210 (i.e., contact line spacer 1600); a photoresist PR over the gate 1210 and over a portion of the gate spacers 1610, 1615; and, a photoresist PR over a portion of the STI oxide member of the second layer 1110 that is farthest from the contact line 1300 (i.e., second STI oxide member 1116). Subsequently, reactive ion etching is performed, stopping at the second nitride layer 1740, to form low-k dielectric members 1810, 1812, 1814. Following this, the photoresists are removed and reactive ion etching is performed. Thus, portions of the second nitride layer 1740 are removed to form dielectric members 1800, 1802, 1804; and, the contact line spacer 1605 is removed (FIG. 18). Because the contact line 1300 is shorter than the gate 1210, the nitride deposited on the contact line 1300 and the contact line spacers 1600, 1605 is shorter and thinner than the nitride deposited on the gate 1210 and the gate spacers 1610, 1615; and thus, portions of the nitride deposited on the contact line 1300 and the contact line spacer 1605 may be removed via reactive ion etching. Moreover, because the MOSFET circuit 200 only comprises a single contact line spacer (i.e., contact line spacer 1600), spacer blockage of the source 1720 and the drain 1730 can be prevented. The method then forms metal vias 1900 and 1902 by depositing tungsten over the contact line 1300 and over a portion of the source 1720, and over a portion of the drain 1730, respectively, followed by chemical mechanical polishing (FIG. 19). To reduce contact resistance, a thin layer of titanium nitride may be deposited over the contact line 1300 and over portions of the source 1720 and the drain 1730 prior to tungsten deposition.

Thus, embodiments herein present a structure, method, etc. for making high density MOSFET circuits with different height contact lines. MOSFET circuits 100 comprise a gate 310 and a contact line 500, wherein the gate 310 comprises a first gate layer situated proximate the contact line 500 and at least one subsequent gate layer situated over the first gate layer. More specifically, as described above, the gate 310 comprises a silicide layer 810 situated over a polysilicon layer 234. In an alternative embodiment of the invention, a gate 1210 could comprise a first polysilicon layer 1130 situated below a polysilicon germanium layer 1140, a second polysilicon layer 1150 situated over the polysilicon germanium layer 1140, and a silicide layer 1710 situated over the second polysilicon layer 1150. The contact line 500 also comprises a silicide layer 800 situated over a polysilicon layer 232; however, the contact line 500 comprises a height that is less than the height of the gate 310 (i.e., the combined height of the first gate layer and the subsequent gate layer(s)).

The MOSFET circuits 100 further comprise gate spacers 710, 715 situated proximate the gate 310 and a single contact line spacer 700 situated proximate the contact line 500. As described above, because the contact line 500 is shorter than the gate 310, the contact line spacer 700 is shorter and thinner than each of the gate spacers 710, 715. Moreover, in addition to the decreased size of the contact line spacer 700, the MOSFET circuits 100 only comprise a single spacer or no spacer for the contact line, which can prevent spacer blockage of the source 820 and the drain 830. Furthermore, a first gate dielectric 725 is situated below the gate 310; and, a second gate dielectric 720 is situated below the contact line 500.

One exemplary method for making the MOSFET circuits 100 comprises forming a gate 310 by forming a first gate layer and forming at least one subsequent gate layer over the first gate layer. More specifically, forming the first gate layer comprises forming a polysilicon layer 230 over a gate dielectric layer 220. Moreover, a contact line 500 is formed during the formation of the first gate layer; i.e., the contact line 500 and the first gate layer are formed simultaneously.

As described above, forming the contact line 500 comprises forming the polysilicon layer 230 over the gate dielectric layer 220 and subsequently implanting a germanium layer 400 over a printed circuit landing pad 300 to dope a portion of the polysilicon layer 230. In other words, the gate 310 and the contact line 500 can be formed by patterning the polysilicon layer 230 for the contact line 500 and the gate 310, and subsequently protecting the gate 310 with a photoresist PR. Then, a doped portion is created by doping the contact lines (i.e., the printed circuit landing pad 300) to a desired height for the contact line 500, wherein the doped portion is subsequently etched. Following this, as described above, the method forms metal vias 1000, 1002 by depositing tungsten over the contact line 500 and over a portion of the source 820, and over a portion of the drain 830, respectively, followed by chemical mechanical polishing.

A gate 1210 and a contact line 1300 can be alternatively formed by depositing a first polysilicon layer 1130 over a substrate, depositing a silicon germanium layer 1140 over the first polysilicon layer 1130, and depositing a second polysilicon layer 1150 over the silicon germanium layer 1140. As described above, the substrate comprises a first layer 1100 comprising silicon oxide 1102 and a second layer 1110 comprising silicon 1112. Next, the first polysilicon layer 1130, the silicon germanium layer 1140, and the second polysilicon layer 1150 are patterned to produce a contact line stack 1200 and the gate 1210. Following this, the gate 1210 is protected with a photoresist PR and portions of the second polysilicon layer 1150 and portions of the silicon germanium layer 1140 are removed from the contact line stack 1200. Thus, the contact line 1300 is formed proximate to the gate 1210, wherein the contact line 1300 is shorter than the gate 1210.

In addition, the method forms first spacers proximate the gate 310 (i.e., gate spacers 710, 715) and second spacers proximate the contact line 500 (i.e., contact line spacers 700, 705). As described above, the spacers are formed by depositing a nitride layer 600 over and around the contact line 500 and the gate 310, wherein portions of the nitride layer 600 are subsequently etched. Because the height of the contact line 500 is less than the height of the gate 310, the second spacers are shorter and thinner than the first spacers. Subsequently, one of the spacers (i.e., contact line spacer 705) is removed from the second spacers by protecting a preserved spacer (i.e., contact line spacer 700) from the second spacers, protecting the first spacers, and etching the MOSFET circuit 100. Accordingly, in addition to the decreased size of the contact line spacer 700, the MOSFET circuit 100 only comprises a single spacer for the contact line, which can prevent spacer blockage of the source 820 and the drain 830. Again, as described above, the method then forms metal vias 1000, 1002 by depositing tungsten over the contact line 500 and over a portion of the source 820, and over a portion of the drain 830, respectively, followed by chemical mechanical polishing.

Figure 20:
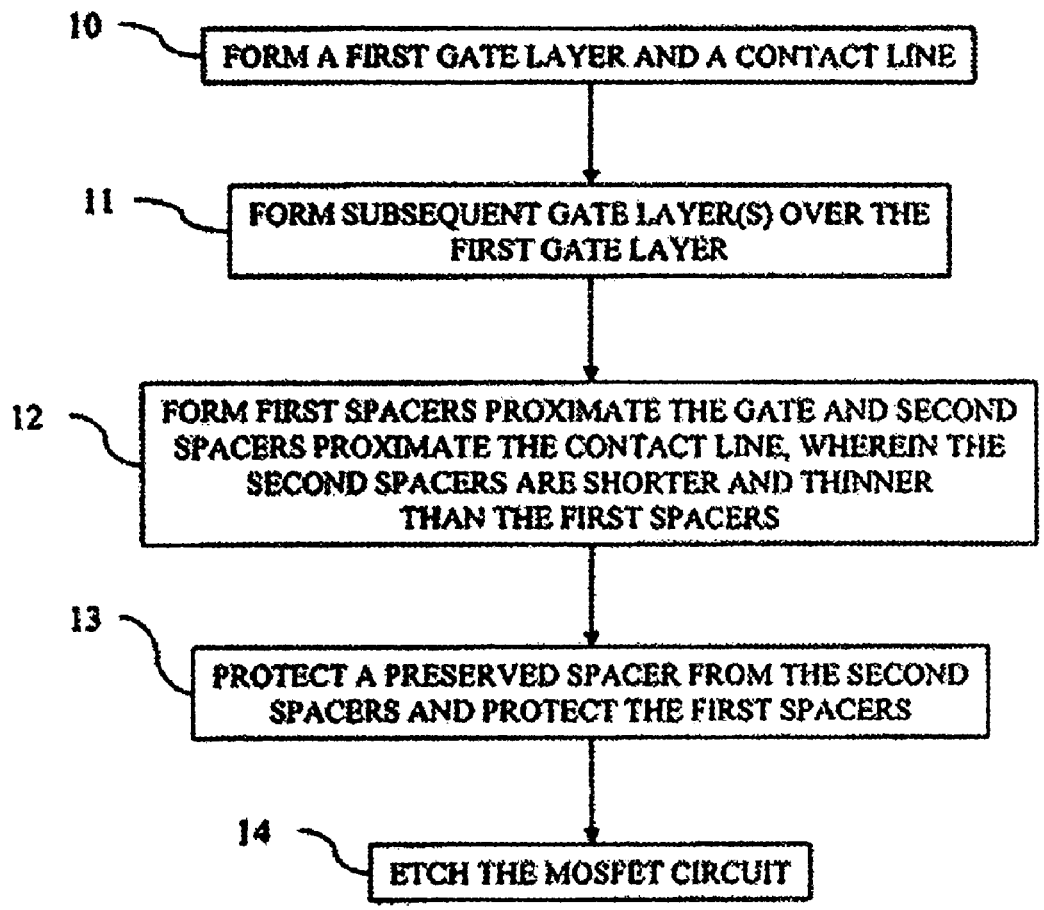
FIG. 20 is a flow diagram of a method of the invention.
Figure 21:
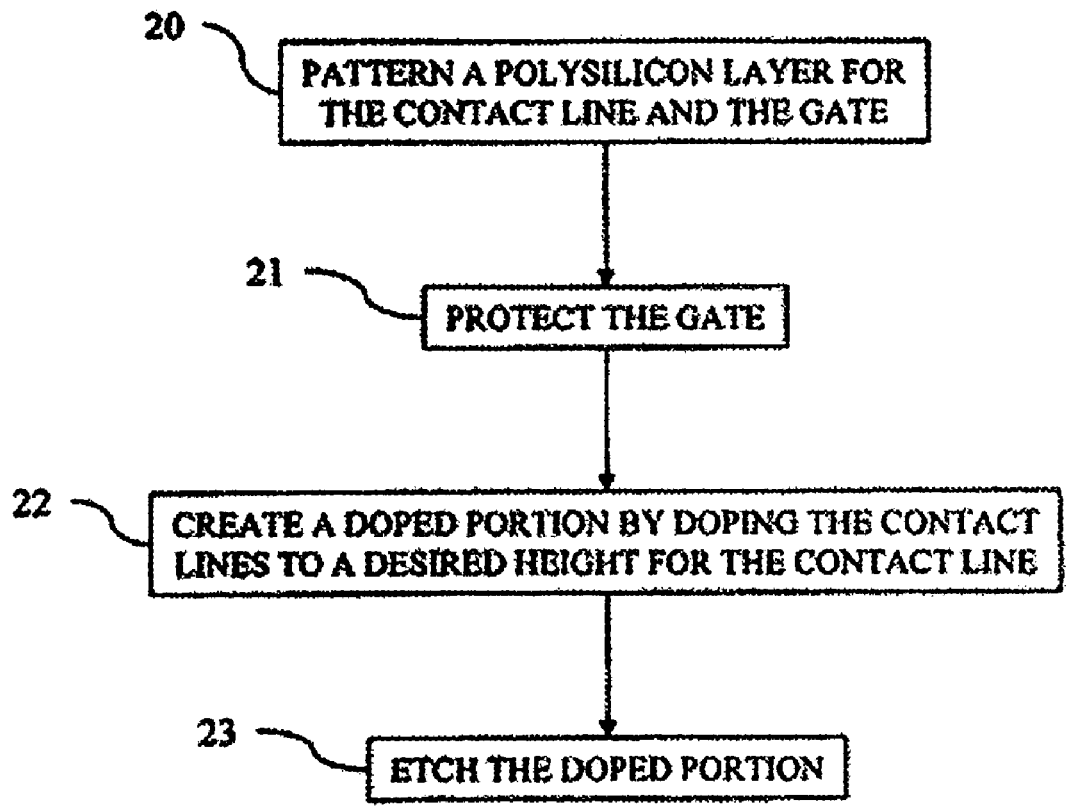
FIG. 21 is a flow diagram of method steps of the invention.
Figure 22:
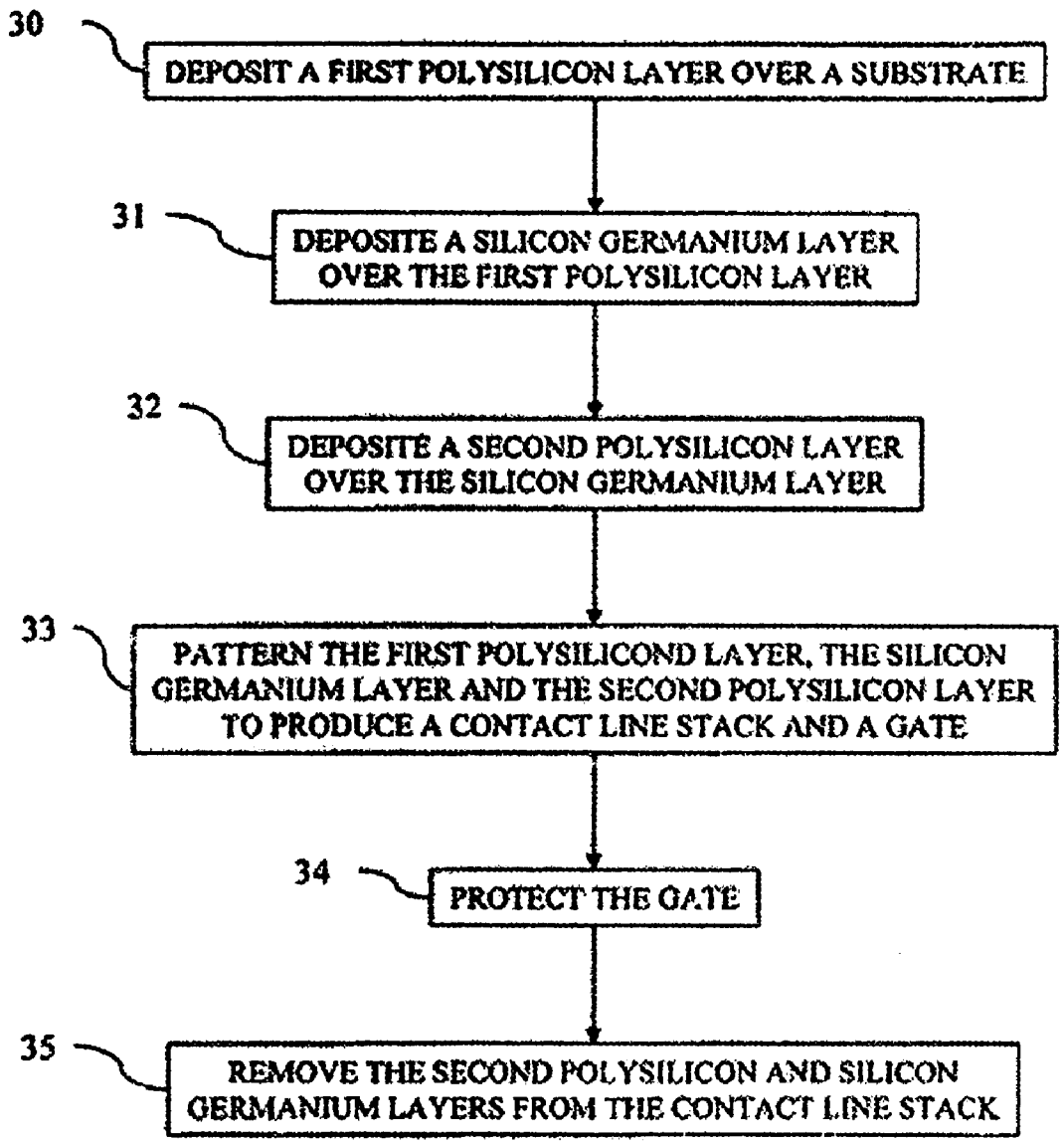
FIG. 22 is a flow diagram of alternative method steps of the invention.

FIGS. 20-22 illustrate flow diagrams of method steps for making high density MOSFET circuits with different height contact lines. In item 10, the method begins by forming a first gate layer and a contact line. As described above, this comprises forming a polysilicon layer over a substrate, wherein the substrate comprises a first layer comprising silicon oxide and a second layer comprising silicon. In item 11, subsequent gate layer(s) are formed over the first gate layer. As described above, the gate layers comprise a height that is greater than the height of the contact line.

More specifically, as illustrated in FIG. 21, the gate layers and contact line may be formed by patterning a polysilicon layer for the contact line and the gate (item 20); protecting the gate (item 21); creating a doped portion by doping the contact lines to a desired height for the contact line (item 22); and etching the doped portion (item 23). Alternatively, as illustrated in FIG. 22, the gate layers and contact line may be formed by depositing a first polysilicon layer over a substrate (item 30); depositing a silicon germanium layer over the first polysilicon layer (item 31); and depositing a second polysilicon layer over the silicon germanium layer (item 32). Following this, the first polysilicon layer, the silicon germanium layer, and the second polysilicon layer are patterned to produce a contact line stack and a gate (item 33); the gate stack is protected (item 34); and, a portion of the second polysilicon layer and a portion of the silicon germanium layer are removed from the contact line stack (item 35).

Referring back now to FIG. 20, in item 12, first spacers are formed proximate the gate and second spacers are formed proximate the contact line, wherein the second spacers are shorter and thinner than the first spacers. As described above, the spacers are formed by depositing a nitride layer over and around the contact line and the gate, wherein portions of the nitride layer are subsequently etched. Following this, a preserved spacer from the second spacers and the first spacers are protected with photoresists (item 13) and the MOSFET circuit is etched (item 14). As described above, because the contact line is shorter than the gate, the contact line spacers (i.e., the second spacers) are shorter and thinner than each gate spacer (i.e., each first spacer) and may be easily removed via reactive ion etching. Thus, in addition to the decreased size of the contact line spacers, the MOSFET circuit only comprises a single spacer for the contact line, which can prevent spacer blockage of the source and the drain.

Accordingly, embodiments of the invention provide a structure and method for making high density MOSFET circuits with different height contact lines. Specifically, lower contact lines are used to reduce both spacer height and spacer thickness. This reduces the chance of spacers blocking via hole etching. Since spacers on polysilicon contact lines can block via contacts, the via contacts can be separated from the source/drain areas of the MOSFET circuit. For example, spacer blocking causes circuit opens in static random access memory (SRAM). This problem is intensified as SRAM areas continue to shrink. Therefore, the structure and method of embodiments of the invention provide a solution that is easy to integrate into conventional processes of MOSFET manufacturing.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A MOSFET circuit, comprising:

a contact line;

a first gate layer situated proximate said contact line, wherein said contact line comprises a height that is less than a height of said first gate layer, and a polysilicon germanium gate layer situated above said first gate layer and below at least one subsequent gate layer.

2. The MOSFET circuit according to claim 1, all the limitations of which are incorporated herein by reference, further comprising:

gate spacers situated proximate said first gate layer; and a single contact line spacer situated proximate said contact line, wherein said contact line spacer comprises a height that is less than a height of said gate spacers.

3. The MOSFET circuit according to claim 1, all the limitations of which are incorporated herein by reference, further comprising:

gate spacers situated proximate said first gate layer; and a single contact line spacer situated proximate said contact line, wherein said contact line spacer comprises a thickness that is less than a thickness of said gate spacers.

4. A MOSFET circuit, comprising:

a contact line;

a first gate layer situated proximate said contact line;

at least one second gate layer situated over said first gate layer;

gate spacers situated proximate said first gate layer and said second gate layer;

less than two contact line spacers situated proximate said contact line; and a polysilicon germanium gate layer situated above said first gate layer and below at least one subsequent gate layer.

5. The MOSFET circuit according to claim 4, all the limitations of which are incorporated herein by reference, wherein said contact line comprises a height that is less than a combined height of said first gate layer and said second gate layer.

6. The MOSFET circuit according to claim 4, all the limitations of which are incorporated herein by reference, wherein said less than two contact line spacers comprises a height that is less than a height of said gate spacers.

7. The MOSFET circuit according to claim 4, all the limitations of which are incorporated herein by reference, wherein said less than two contact line spacers comprises a thickness that is less than a thickness of said gate spacers.

* * * * *